United States Patent [19]

Dombrowski

[11] Patent Number: 5,581,738
[45] Date of Patent: Dec. 3, 1996

[54] METHOD AND APPARATUS FOR BACK-ANNOTATING TIMING CONSTRAINTS INTO SIMULATION MODELS OF FIELD PROGRAMMABLE GATE ARRAYS

[75] Inventor: Peter F. Dombrowski, Boulder, Colo.

[73] Assignee: Xilinx, Inc., San Jose, Calif.

[21] Appl. No.: 73,329

[22] Filed: Jun. 7, 1993

[51] Int. Cl.$^6$ .................................................... G06F 17/00
[52] U.S. Cl. .......................... 395/500; 364/488; 364/490; 364/578; 326/38
[58] Field of Search ...................................... 364/488, 489, 364/490, 578, 491, 569; 371/22.2, 23, 22.3; 395/500; 326/38, 39, 41, 47, 40, 93, 101

[56] References Cited

U.S. PATENT DOCUMENTS

| | | | |
|---|---|---|---|
| 4,698,760 | 10/1987 | Lembach et al. | 364/490 |
| 5,095,454 | 3/1992 | Huang | 364/578 |
| 5,210,700 | 5/1993 | Tom | 364/488 |
| 5,218,551 | 6/1993 | Agrawal et al. | 364/491 |
| 5,258,932 | 11/1993 | Matsuzaki | 364/578 |
| 5,278,769 | 1/1994 | Bair et al. | 364/490 |
| 5,302,865 | 4/1994 | Steele et al. | 307/465 |
| 5,369,604 | 11/1994 | Ravindranath et al. | 364/578 |
| 5,383,167 | 1/1995 | Weil | 364/488 |

OTHER PUBLICATIONS

Cherry, "Pearl: A CMOS Timing Analyzer", IEEE, 1988 Mar., pp. 148–153.

Press, William H. et al. Numerical Recipes in C "Solution of Linear Algebracia Equations", 1988, pp. 28–46 (Month is not available).

*Primary Examiner*—Kevin J. Teska
*Assistant Examiner*—Tan Nguyen
*Attorney, Agent, or Firm*—Gregg I. Anderson; Anthony C. Murabito

[57] ABSTRACT

A method and apparatus for back-annotating timing constraints onto a logical simulation model of a field programmable gate array circuit includes a process and system for creating equations relating to the sequence of nodes between an input and output or clock input in the logical circuit and equating this to the external timing characteristics of the FPGA circuit. This linear system of equations can then be solved to obtain the individual timing constraints for each node of the circuit within the simulation model.

23 Claims, 23 Drawing Sheets

METHOD AND APPARATUS FOR BACK-ANNOTATING TIMING CONSTRAINTS INTO SIMULATION MODELS OF FIELD PROGRAMMABLE GATE ARRAYS

BACKGROUND OF THE INVENTION

1. Field of the Invention

This invention pertains to the field of designing digital circuitry using programmable logic devices. More particularly, this invention pertains to a method and apparatus for accurately assigning timing delays from a cell within a programmable logic device to primitives in the designer's abstract representation of their circuit so that the timing characteristics of the overall circuit and of each primitive can be simulated and analyzed.

2. Background of the Invention

A field programmable gate array ("FPGA") is a relatively new type of programmable logic device, first introduced by Xilinx, Inc. in 1985. An FPGA includes cells which can be programmed to perform a variety of logical functions and also includes programmable interconnects to connect the logical cells in a general way. The cells and interconnects are used to implement complex logical circuits. The use of FPGAs continues to grow at a rapid rate due to the relatively shorter design cycles, reduced costs through logic consolidation and the flexibility offered by their re-programmability.

The digital circuit designer typically follows the pattern shown in FIG. 1 to implement a design in an FPGA.

The designer begins with an abstract representation 30 of the circuit to be implemented in the FPGA. This representation may be in the form of a schematic or in a hardware descriptive language such as VHDL. The abstract representation is provided to a technology mapper 32 which converts the representation into cells for implementation in an FPGA. A place and route operation 34 is performed to give the cells a geographic location in the FPGA and to interconnect the cells. At this point the designer has a circuit 34 which could be implemented into an FPGA. Typically, the designer next performs a simulation 36 of the FPGA circuitry in a logical simulator. The logical simulator is used to understand the logical correctness of the circuit as well as its timing behavior. If the designer is satisfied after analysis 38 of the simulation, he may decide 40 to encode 42 the FPGA circuit design and layout into a PROM which can download the circuit into the FPGA for operation. If, however, the designer is not satisfied with the analysis of the simulation, the designer can redesign 44 portions of the FPGA circuit to obtain more optimal logical or timing characteristics. After this redesign, further simulation 36 and analysis 38 may take place. This process can be repeated continuously until optimal results are achieved or other constraints cause the design phase to be halted or the design to be implemented.

This design approach has obvious problems and difficulties. The primary problem is the amount of time and effort consumed in repeated redesign. Typically, designers may choose FPGAs to implement designs operating at data speeds up to 25–35 mHz. Even if the designer wishes to implement designs operating in this range, it may be necessary for the designer to go through meticulous design capture and manual redesign of certain portions of the FPGA circuitry in order to achieve proper operation at these high speeds. In other words, the FPGA circuit design provided by the technology mapper may have be to modified to operate properly at the desired speed.

Complicating matters further, the technology mapper modifies the abstract circuit input by the designer while maintaining the specified relationship between inputs and outputs of the circuit. Thus, the technology mapper is likely to create a different internal circuit design than contemplated by the designer in order to optimally implement the circuit in the FPGA device. In so modifying the internal circuit design, certain intermediate logic and signals familiar to the designer may be eliminated.

Further, FPGA vendors specify timing characteristics of their FPGA circuitry only in terms of the timing relationship between the external pins on the internal components or cells, such as Xilinx's configurable logic blocks (CLBs). Each CLB typically includes a significant amount of digital circuitry. No internal timing information is given for this circuitry. Thus, the internal components of the CLB do not have timing characteristics specified for them. In addition, the designer is not presented with information relating the FPGA circuit to the abstract representation from which the FPGA circuit was created. For this reason, the designer cannot readily appreciate the timing limitations of the circuit in terms of his abstract representation.

Most importantly, logical simulations are run on the circuitry as laid out in the FPGA with the external timing characteristics. The designer, who typically visualizes the circuit in terms of the abstract representation rather than the FPGA circuit, has trouble working with, understanding and interpreting the logical simulation. It is against this background and to overcome the shortcomings of the prior art that the present invention has been developed.

SUMMARY OF THE INVENTION

The method for back-annotating timing constraints into simulation models of programmable logic devices is adapted to be used to more effectively simulate the operation of a cell of a programmable logic device that has been programmed by mapping, placing and routing an abstract representation of a logic design including a plurality of primitives into the cells of the programmable logic device. Each cell of the programmable logic device has predetermined external timing characteristics which may be back-annotated onto the primitives of the simulation by the steps of: (a) converting each internal timing specification on the programmable logic device cell into one or more linear equations involving the timing constraints for the primitives mapped into the cell; (b) grouping the equations into a linear system of equations; and (c) solving the linear system of equations to obtain the timing constraints for the primitives mapped into the cell.

The system for back-annotating timing constraints into simulations of programmable logic devices is adapted to be used to more effectively simulate the operation of a cell of a programmable logic device that has been programmed by mapping, placing and routing an abstract representation of a logic design including a plurality of primitives into the cells of the programmable logic device. Each cell of the programmable logic device has predetermined external timing characteristics which may be back-annotated onto the primitives of the simulation by utilizing the system including: (a) means for converting each external timing specification on the programmable logic device cell into one or more linear equations involving the timing constraints for the primitives mapped into the cell; (b) means operatively associated with the converting means for grouping the equations into a linear systems of equations; and (c) means operatively associated with the grouping means for solving the linear system of equations to obtain the timing constraints for the primitives mapped into the cell.

Other features of the method and apparatus for back-annotating timing constraints into simulation models of programmable logic devices include creating separate linear equations for combinatorial DELAY constraints, SETUP constraints associated with sequential primitives, and HOLD constraints associated with sequential primitives. Other features include obtaining timing constraints for the primitives which include values for both rising edges and falling edges.

Other aspects, features and details of the present invention can be more completely understood by reference to the following detailed description of the preferred embodiment, taken in conjunction with the drawings, and from the appended claims.

DETAILED DESCRIPTION OF THE DRAWINGS

DESCRIPTION OF THE PREFERRED EMBODIMENT

The method and apparatus for back-annotating a simulation model of a field programmable gate array (FPGA) can best be appreciated after a discussion of the relevant hardware, architecture, and block diagrams related to the present invention. First, there will be a brief discussion of the FPGA architecture followed by a discussion of the modified design flow of a digital designer utilizing the present invention and a block diagram of the system of the present invention. Next, a sample logical circuit will be introduced along with a discussion of the primitive library available from the assignee of the present invention for both abstract circuit design and simulation utilizing the present invention. Following this, a discussion of the top level flow diagram of the back-annotation method and a discussion of the details of the method will take place.

FPGA Architecture

Figure 2:
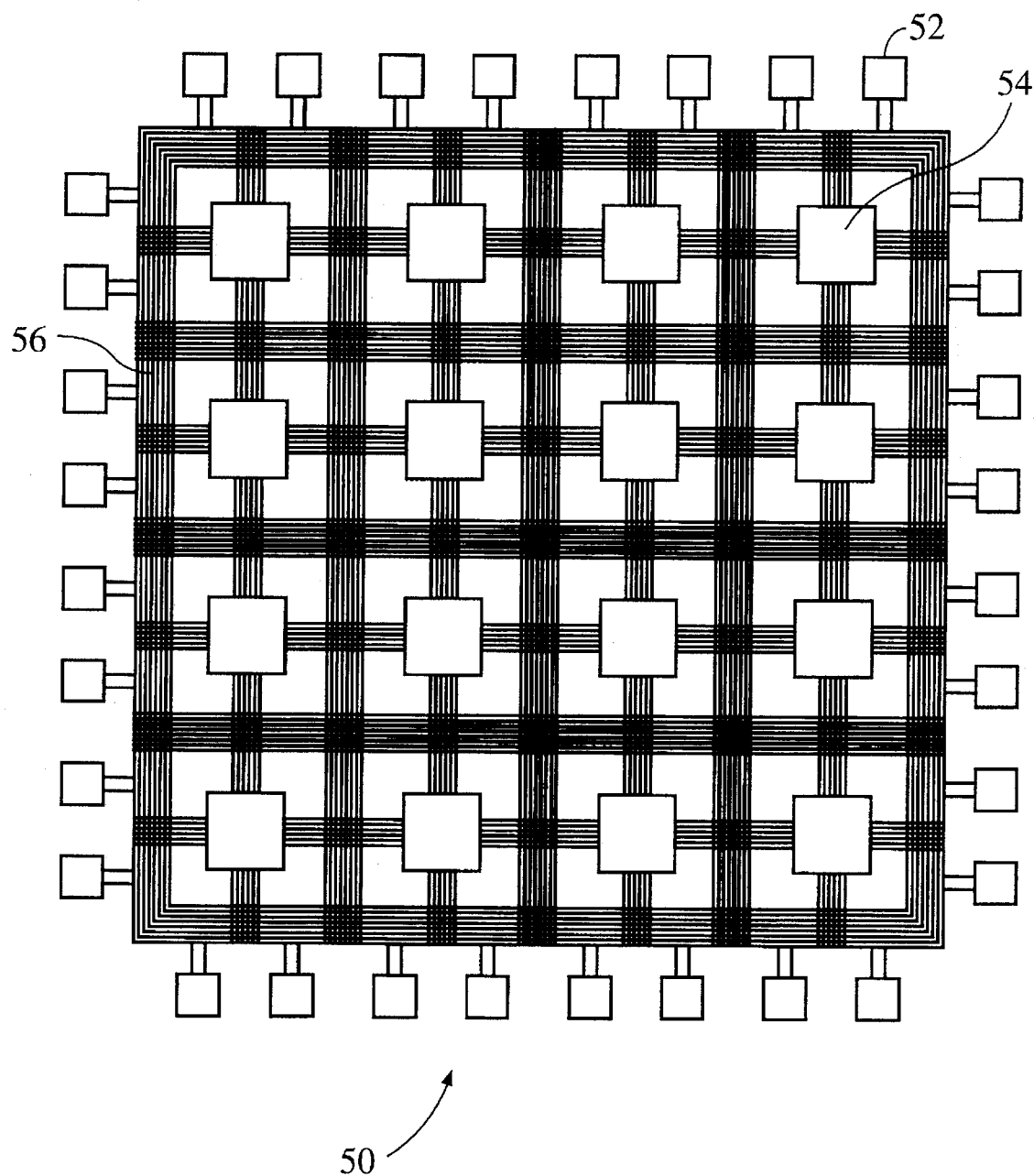
FIG. 2 is a conceptual, schematic diagram of a typical FPGA device illustrating the provision of a number of logic blocks and programmable interconnection resources thereof.

Referring now to FIG. 2, a conceptual FPGA 50 is shown. Conceptual FPGA 50 includes a number of logic blocks or cells 54 and input/output ("I/O") cells 52. Logic blocks 54 and I/O cells 52 may be programmably interconnected to perform defined logic functions by means of programmable interconnection resources 56.

There are four primary steps in programming conceptual FPGA 50 with a specific circuit implementation. The first is technology mapping/optimization, which decomposes the circuit into smaller, logical elements and then recombines the elements into blocks of logic which can be implemented by the logic blocks 54 on the conceptual FPGA 50. The second step is placement which assigns the mapped logic blocks 54 to specific cell locations on the conceptual FPGA 50. The third step is routing which chooses the interconnect points that must be enabled so that the cells containing logic blocks 54 may be connected to one another by means of interconnection resources 56. Ultimately, the cell and interconnect programming is encoded in a bit stream which is eventually downloaded to the conceptual FPGA 50, turning "on", or "off" the appropriate interconnect switches, whereupon the device is ready to be operated as a physical implementation of the specified circuit.

Figure 3A:
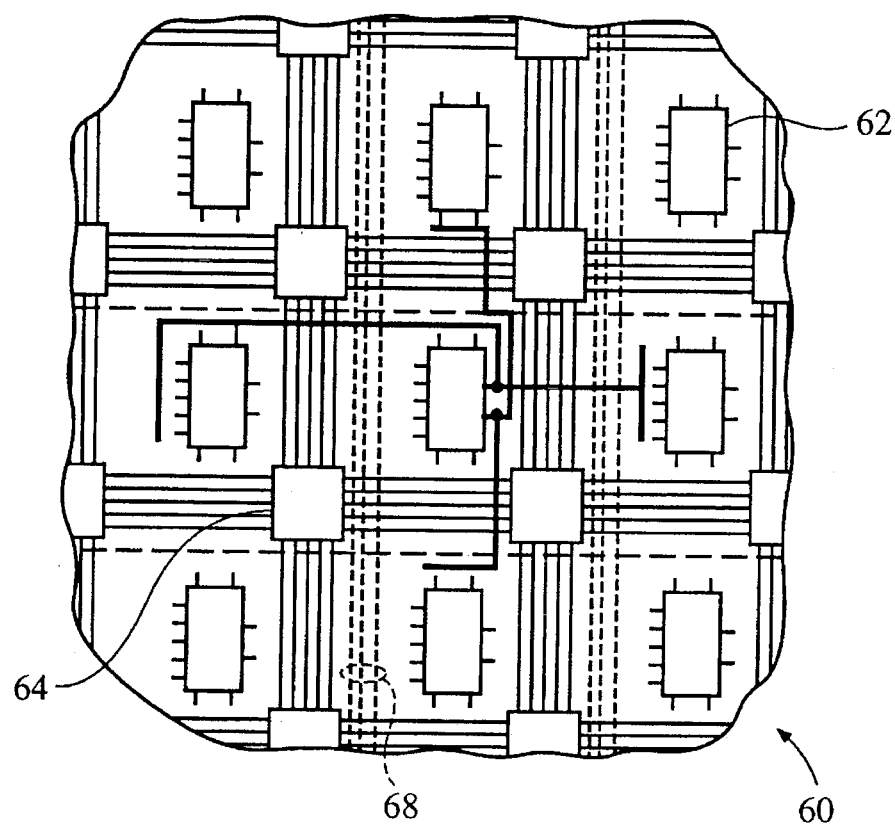
FIG. 3a is a simplified illustration of a portion of an FPGA device, as an example of one type of FPGA only, illustrating a number of logic blocks and switch matrices and the variety of programmable interconnects typically provided therein.

Referring now to FIG. 3a, a portion of an FPGA 60 is shown. FPGA 60 which, as a representative example only, depicts a Xilinx XC3000 device, comprises, in pertinent part, a number of logic blocks 62 and switch matrices 64.

Figure 3B:
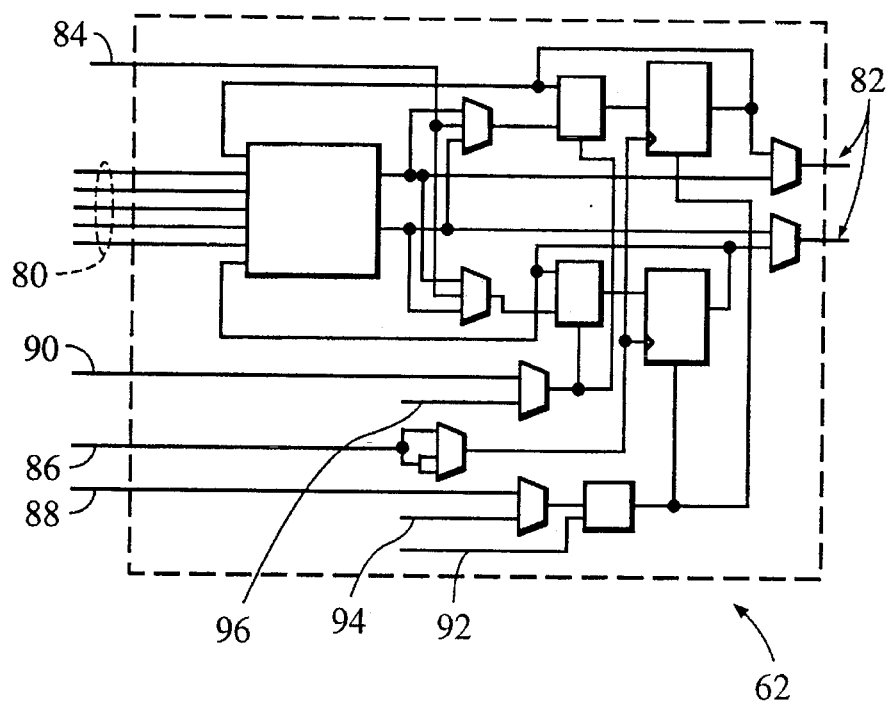
FIG. 3b is a representative illustration of a logic block of the FPGA of FIG. 3a showing the various available signal inputs and outputs thereof.

Referring additionally now to FIG. 3b, a logic block 62 of FPGA 60 of FIG. 3a is shown. Logic block 62 comprises a number of signal inputs and signal outputs which determine its functionality in the particular design to which it is mapped. In general, logic block 62 may include a plurality of inputs 80 (designated A–E), and outputs 82 (designated X–Y) depending on the programming thereof. Logic block 62 further includes a data input 84, clock input 86, reset input 88, and clock enable input 90. Logic block 62 may also include a global reset 92, circuit ground 94 and power input 96.

FPGA 60 utilizes clock signals which have voltages which rise and fall regularly. The frequency of the clock signals is a measure of how fast FPGA 60 will operate. FPGA 60 will typically operate more slowly than other devices in the system into which it is incorporated and it tends to represent the lower bound of system operating frequency. It is, therefore, usually desirable to have FPGA 60 operate as fast as possible in a given specific circuit implementation. As has been previously described, FPGA 60 comprises a number of cells containing logic blocks 62 which can be programmed to perform a variety of logical functions, and a number of interconnection resources which can be programmed to connect the cells in a general way. The cells and interconnection resources are used to implement complex logical circuits.

The system and method of the present invention is implemented in a single executable computer timing module designed to be utilized with the NeoCAD™ FPGA Foundry™ device-independent modular toolset for FPGA design available from NeoCAD, Inc., 2585 Central Avenue, Boulder, Colo. 80301, assignee of the present invention. The Foundry operating environment, as with that of the timing module embodying the system and method of the present invention, includes a number of industry-standard digital computer platforms. Representative of the possible hardware operating environments are personal computer ("PC") based systems and workstations. Suggested hardware platforms include a) an IBM-PC® or compatible 386/486SX (with coprocessor) or 486; MS DOS® 4.1 or higher; Microsoft® Windows 3.0 or higher in enhanced mode; a minimum of 16 MB of random access memory ("RAM"); 40 MB of disk space for the first family of FPGA's supported and 20 MB for each additional family; Swap: 10 MB permanent Microsoft Windows swap file; Color VGA monitor; ⅔ button Microsoft Windows compatible mouse; and one parallel port for transport security device; and b) a Sun® SPARCstation® or compatible; SunOS® 4.1.1 or higher; X Windows® version X11R4 or higher and OSF® Motif 1.1; a minimum of 32 MB or RAM; 45 MB of disk space for the first family of FPGA's supported and 20 MB for each additional family; Swap space of 32 MB; color monitor; 3 button mouse and one serial port for a security device. Additionally, the timing module embodying the system and method of the present invention may be utilized in conjunction with the Prism™ device independent logic-partitioning system for FPGA design, EPIC™ editor for programmable IC's and TRACE™ FPGA specific timing analyzer also available from NeoCAD, Inc.

Modified Design Flow and Block Diagram of System

Figure 1:
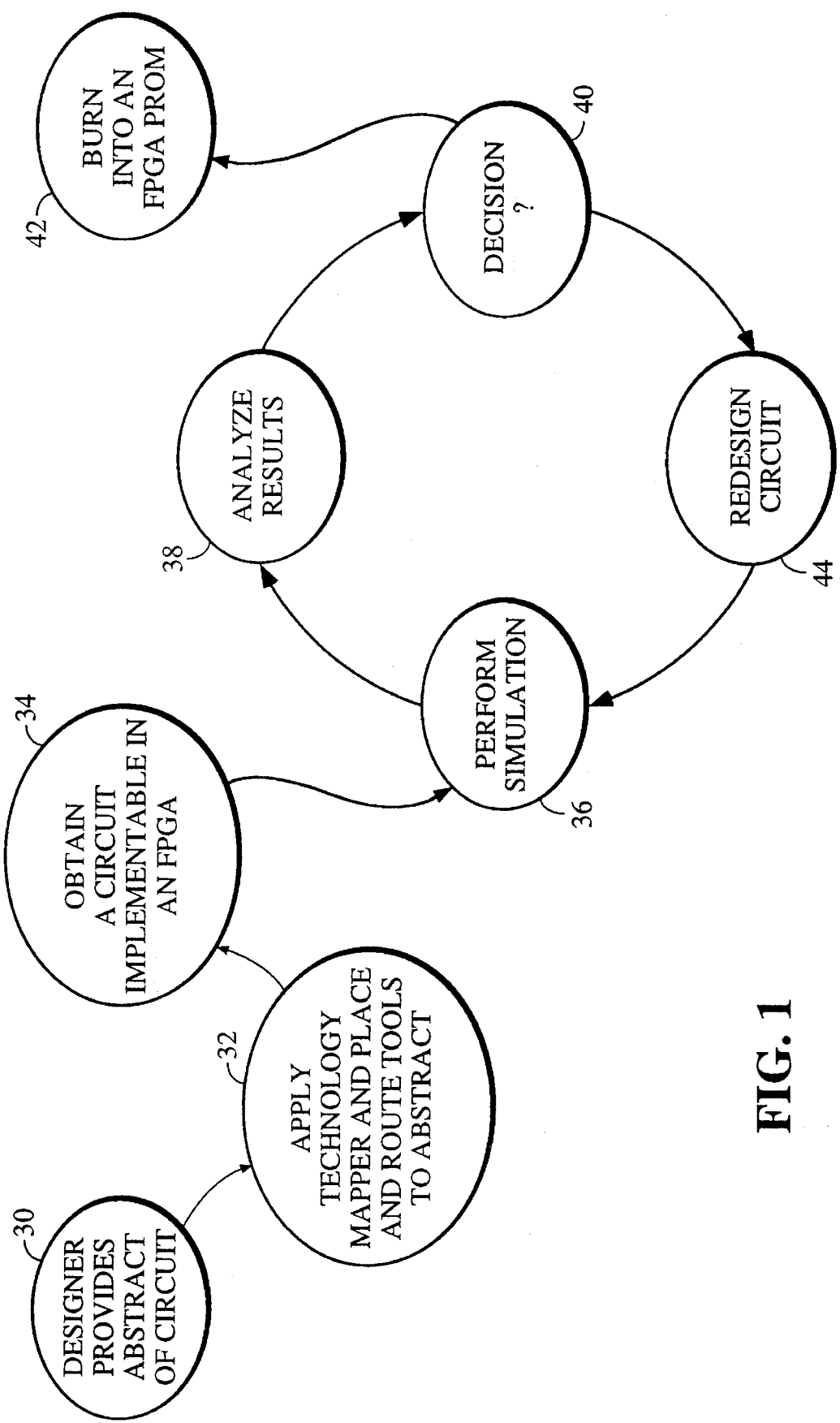
FIG. 1 is an illustration of the design flow of a field programmable gate array.

Referring to FIG. 1 discussed above in the background, it can be appreciated that the present invention improves the performance simulation step 36 of the design shown in FIG. 1. Because the simulation is improved and the designer is better able to analyze results and better able to redesign the circuit, the circular path of the steps of perform simulation 36, analyze results 38, decide 40 and redesign circuit 44 will be repeated significantly fewer times by utilizing the present invention as compared with designing without the present invention.

Figure 4:
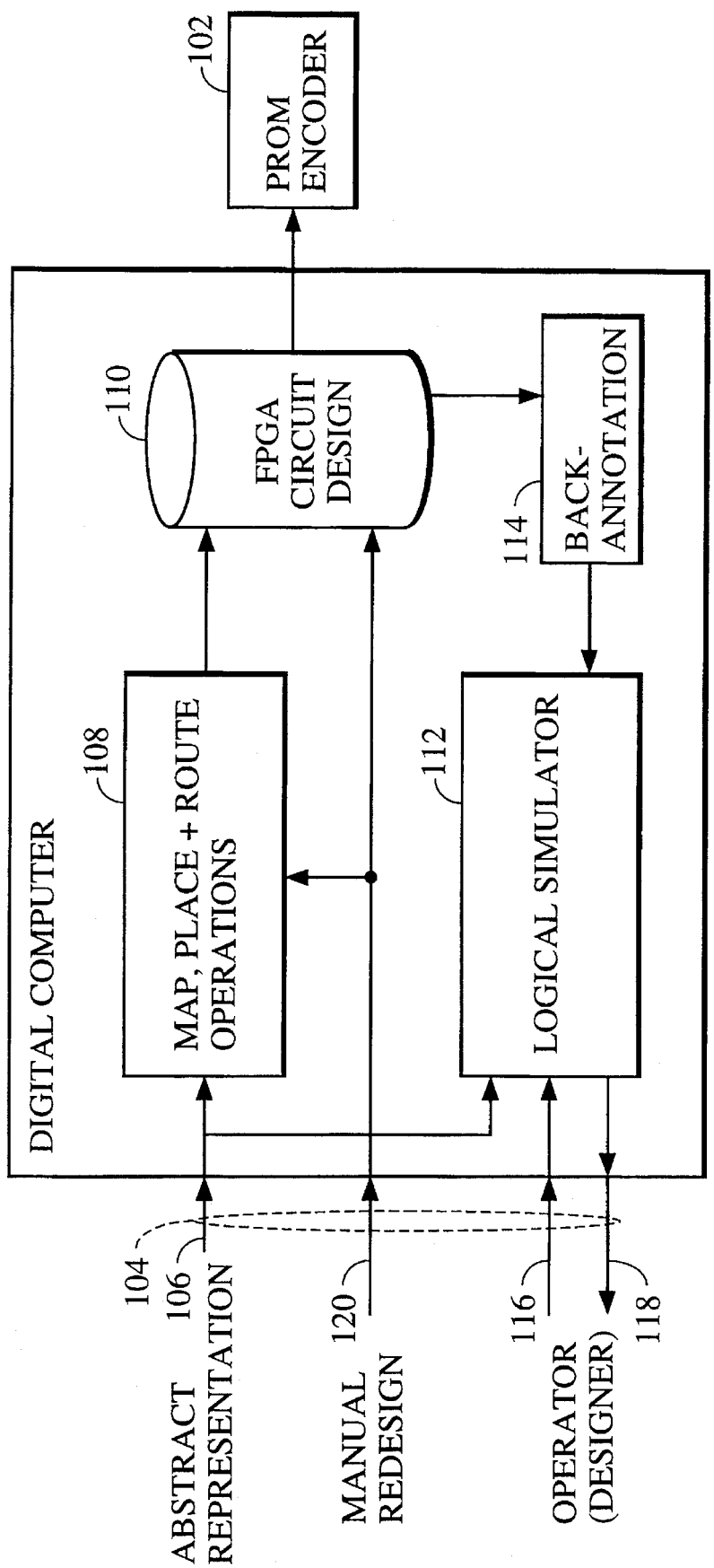
FIG. 4 is a block diagram of the hardware and architecture of the system of the present invention.

The block diagram of FIG. 4 shows the interrelationship of a digital computer 100, a PROM encoder 102 and several operator inputs and outputs 104. Shown as a first input 106 to the digital computer is an abstract representation from the operator or designer in the form of a schematic or hardware descriptive language such as VHDL. The abstract representation is provided to a map, place, and route operation 108 which creates an FPGA circuit design 110 implementable into an FPGA. As shown in FIG. 2, this circuit design may be immediately implemented into an FPGA by encoding the circuit design into a PROM for subsequent downloading into the FPGA. More typically, however, the designer wishes to perform a logical simulation of the circuit design to analyze its timing characteristics. Two examples of logic simulators are "Quicksim II" produced by Mentor Graphics of Wilsonville, Oreg. and "Viewsim" produced by Viewlogic of Marlboro, Mass.

In this case, a logical simulator 112 receives inputs from the abstract representation so that the logical simulator may perform the simulation in the realm of the abstract representation rather than in the realm of the FPGA circuit design 110. The logical simulator also receives an input from the FPGA circuit design via a process known as back-annotation 114. Generally, back-annotation takes the external timing characteristics on each cell within the FPGA and converts these characteristics into timing constraints for each individual logical component within the abstract representation in the simulation. This process is the subject of the present invention. The logical simulator also receives inputs 116 from the operator or designer including the speed and inputs to be used in the simulation run. The logical simulator also outputs results 118 to the operator. After analyzing the results, the operator can manually redesign the circuit, shown here as input 120.

Figure 5:
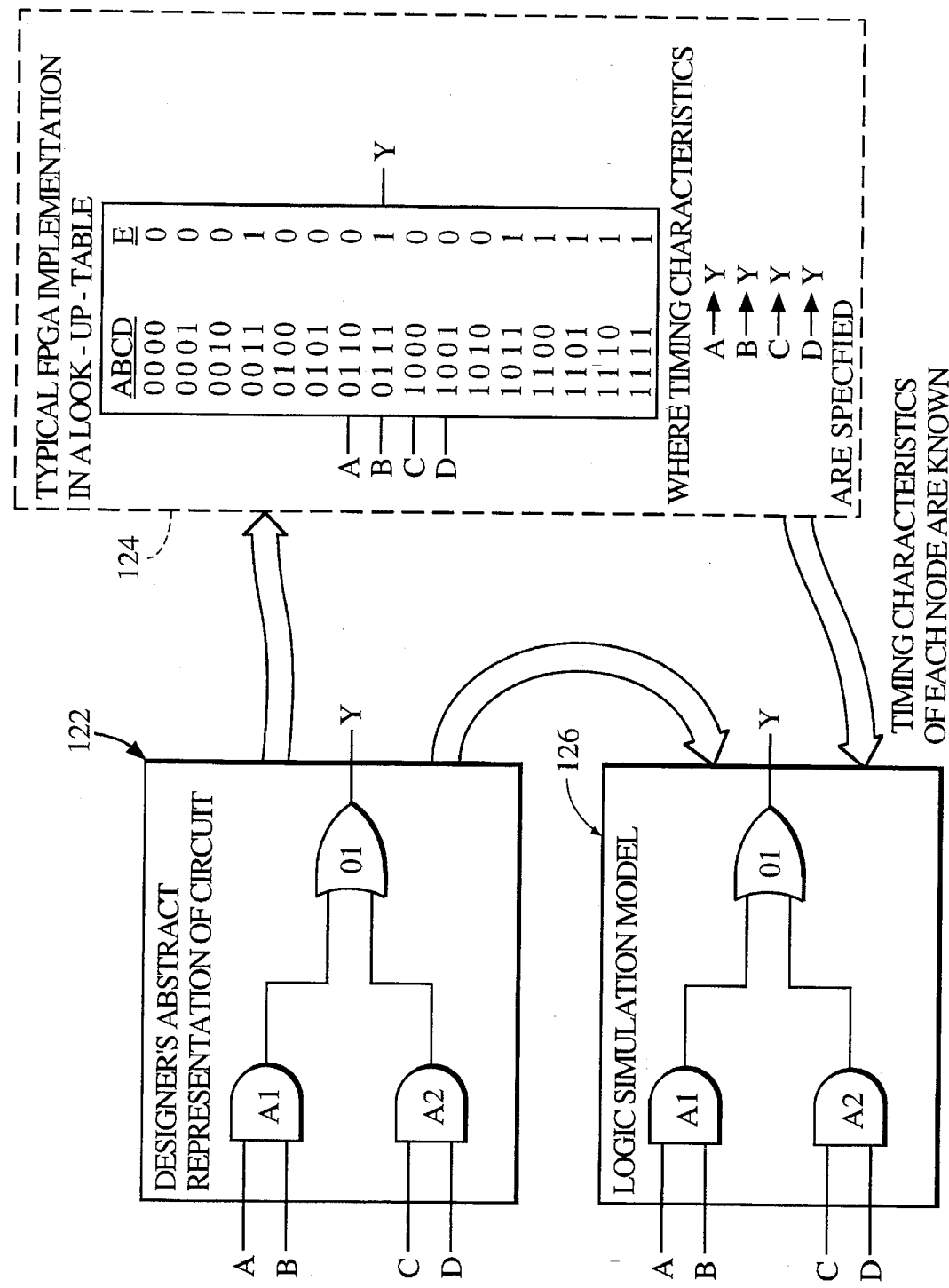
FIG. 5 is a representation of the transformations made in programming a circuit into an FPGA and in simulating the circuit using the teachings of the present invention.

FIG. 5 further describes the relationship between a designer's abstract representation 122 of the circuit, a typical FPGA implementation 124 of the circuit, and a logical simulation model 126 of the circuit using the present invention. The abstract representation 122 in this example can be seen to include four inputs A, B, C and D and one output, Y. Within the abstract representation of the circuit are a pair of AND gates A1 and A2 and an OR gate O1. It can be appreciated that the state of all four inputs A, B, C, and D help to determine the state of the output Y. FIG. 5 also shows a typical FPGA implementation 124 of the same circuit shown in typical Xilinx architecture. Xilinx commonly represents such a circuit in the form of a look-up table. This look-up table is represented in FIG. 5 by a Boolean truth table. It can be seen that with four inputs A, B, C and D, there are two to the fourth power or sixteen possible combinations of digital low and digital high inputs. The look-up table provides the output Y which would result from each of the sixteen possible input combinations. It can be appreciated that the look-up table provides the same output for the same given input as is provided by the designer's abstract representation of the circuit.

In addition, the FPGA manufacturer specifies timing characteristics for each cell within the FPGA. In a simple case, the external timing characteristics of the cell would specify the timing delay between a change in input at pin A and a change in output at pin Y. A similar specification would be provided for the timing delay from pin B to pin Y, pin C to pin Y and pin D to pin Y. The present invention takes these timing characteristics and converts them into timing characteristics for each internal point, or node, within the abstract representation of the circuit used in the logical simulation model 126.

Sample Logical Circuit

Figure 6:
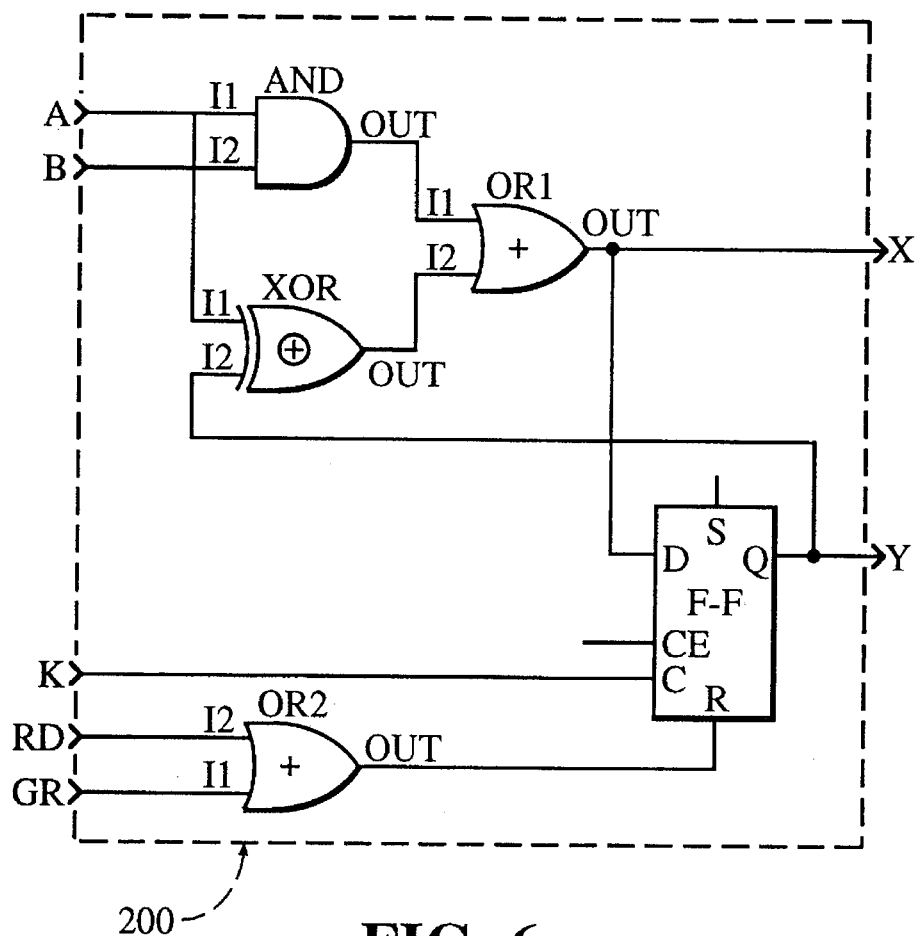
FIG. 6 is a sample logical circuit used as an example in this specification.

FIG. 6 illustrates a sample logical circuit 200 which will be used to illustrate some concepts of the present invention and referred to throughout the remainder of the specification. The circuit has five inputs, A, B, K, RD and GR. The circuit has two outputs, X and Y. Within the circuit is an AND gate (AND), two OR gates (OR1 and OR2), an exclusive or gate (XOR), and a flip-flop (FF). This circuit is an example of an abstract representation of the circuit as developed by the circuit designer. Each of the gates and flip-flops within the circuit is known as a primitive. Each pin of each primitive is labeled. Each of these labeled pins is known as a node. The gates, AND, OR1, OR2 and XOR each have two inputs, I1 and I2, and one output, OUT. A specific node will be referred to by the primitive and the pin, e.g. OR1:OUT.

As discussed above with FIG. 5, the mapping, placing and routing operation of the NeoCAD™ Foundry™ set will generate an FPGA circuit implementation which is different from the abstract representation. However, the same relationship between each of the inputs and outputs will be maintained. The FPGA vendor will specify external timing characteristics describing the timing relationship between inputs A, B, K, RD and GR and outputs X and Y. For the case of the circuit in FIG. 6, the external timing specification for the cell will include the delay from pin A to pin X, the delay from pin B to pin X, the delay from pin K to pin X, the delay from pin K to pin Y, the delay from pin RD to pin Y, and the delay from pin GR to pin Y. These are known as "DELAY" timing constraints. Because a clocked or sequential device, in this case the flip-flop (FF), is included in this circuit, there will also be "SETUP" and "HOLD" timing constraints. The SETUP timing constraint will be specified from pin A to pin K and from pin B to pin K. The HOLD timing constraints shall be specified from pin A to pin K and from pin B to pin K.

Figure 7:
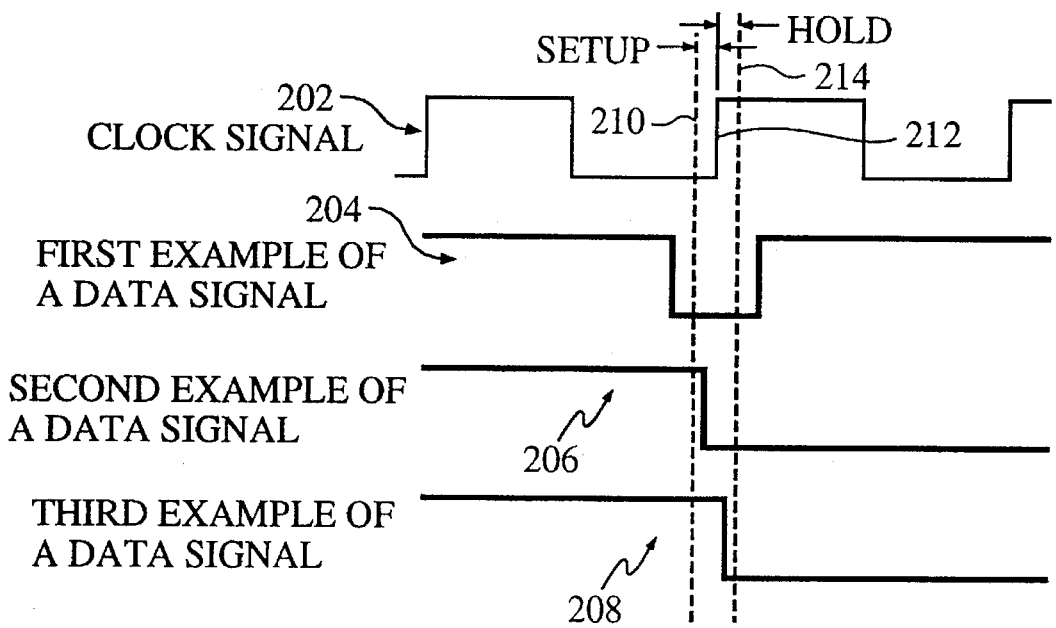
FIG. 7 is a timing diagram of a clock signal and three data input signals used as an example in this specification.

FIG. 7 provides an illustration of SETUP and HOLD timing constraints. FIG. 7 shows a timing diagram of a clock signal 202 and three data input signals 204, 206 and 208. The SETUP timing constraint is defined as the time period before the rising edge of the clock signal during which the input data must be stable. In this example, the beginning of the SETUP period is illustrated by a dotted line 210. Thus, the SETUP timing constraint is the length of time between the dotted line 210 and a rising edge 212 of the clock signal. The end of the HOLD period is illustrated by a second dotted line 214. Thus, for the first data input signal 204, it can be seen that this data signal does not violate the SETUP and HOLD timing constraints because the data is stable during the SETUP time period and during the HOLD time period. However, the second data signal 206 illustrates a data input signal which changes during the SETUP time period and thus violates the SETUP timing constraint. Similarly, the third data input signal 208 illustrates an data signal which changes during the HOLD time period and violates the HOLD timing constraint. The simulator may provide the operator with an indication that the SETUP or HOLD constraints have been violated.

Referring again to FIG. 6, it can be seen that an equation can be created by combining the delays associated with each node between external input A and external output X and equating this sum to the DELAY time between A and X.

$$AND{:}I1{+}AND{:}OUT{+}OR1{:}I1{+}OR1{:}OUT{=}DELAY(A,X)$$

Also, a second equation can be created:

$$XOR{:}I1{+}XOR{:}OUT{+}OR1{:}I2{+}OR1{:}OUT{=}DELAY(A,X)$$

for a second combinatorial path from A to X. Similarly, it can be appreciated that a DELAY equation can be created for a path from B to X, from K to X, from K to Y, from RD to Y, and from GR to Y.

Similarly, each SETUP specification can be translated into a set of equations by forward tracing (assigning coefficients of +1) from an external input such as A up to the data input of a sequential element such as FF, and then backward tracing (assigning coeffiecients of −1) from that sequential element's clock pin to the clock input of the circuit, K. For example, $$AND{:}I1{+}AND{:}OUT{+}OR1{:}I1{+}OR1{:}OUT{+}FF{:}D{+}FF{:}D(SETUP){-}FF{:}C{=}SETUP(A,K)$$

Similarly, a second equation for another path from A to K can be created as well as an equation for a path from B to K.

To create a HOLD equation, the path is forward traced (assigning coefficients of +1) from the clock input of the circuit to the sequential element's clock pin and then backward traced (assigning coefficients of −1) from the sequential element's data pin to an external input. This sum is equated to the HOLD constraint. However, it turns out that the HOLD equation can also be created by multiplying each term of the corresponding SETUP equation by −1 and substituting the sequential element's HOLD node for the SETUP node and equating this sum to the HOLD constraint.

Primitive Library

The following describes the set of primitives that have a defined function and pin set. In general, a design must be expanded completely into primitives in order to be processed by a technology mapper or to be simulated. This set of primitives is intended to encompass all of the generic features of each FPGA architecture.

Each of the following sections describe a single primitive type (with the given name). Each description includes an unordered list of the primitive pins that make up the primitive. Note that several primitives are parameterizable; they have a variable width that must be specified when the primitive is created. Note also that any primitive pin can have its logical function inverted. Thus, AND primitives are provided and NANDs are not (can be fabricated by inverting AND output).

Each primitive pin is further accompanied by a list of DELAY/SETUP/HOLD properties that are provided as part of the simulation model on all computer-aided-engineering systems. These properties include the signal edge on which they are active. The signal edge is defined as being on the external side of any inversion on a pin of a primitive. Thus, SETUP(rise) to CLK(fall) indicates a SETUP constraint between the rising edge of the given pin and the falling edge of the CLK pin. Note that properties are included for the inactive edges of pins (i.e. falling edge on rising edge triggered FF/LATCH) to accommodate pin inversions.

1. NG_PRIMITIVE_BUF ("NEOBUF")

This is a simple buffer that copies its input to its output.

| Pins: | "IN" | : input DELAY(rise), DELAY(fall) |
|---|---|---|
| | "OUT" | : output DELAY(rise), DELAY(fall) |

2. NG_PRIMITIVE_AND ("NEOANDn")

This is a parameterizable AND gate. From 2 to 64K inputs are ANDed into a single output.

| Pins: | "INn" | : inputs (many) |
| | | DELAY(rise), DELAY(fall) |
| | "OUT" | : output |
| | | DELAY(rise), DELAY(fall) |

3. NG_PRIMITIVE_OR ("NEOORn")

This is a parameterizable OR gate. From 2 to 64K inputs are ORed into a single output.

| Pins: | "INn" | : inputs (many) |
| | | DELAY(rise), DELAY(fall) |
| | "OUT" | : output |
| | | DELAY(rise), DELAY(fall) |

4. NG_PRIMITIVE_XOR ("NEOXORn")

This is a parameterizable XOR gate. From 2 to 64 K inputs are XORed into a single output.

| Pins: | "INn" | : inputs (many) |
| | | DELAY(rise), DELAY(fall) |
| | "OUT" | : output |
| | | DELAY(rise), DELAY(fall) |

5. NG_PRIMITIVE_TRI ("NEOTRI")

This is a tri-state buffer. A single data input is driven to an output, conditioned by a control input. Output data is tri-stated when the control input is low, and active when the control input is high.

| Pins: | "IN" | : data input |
| | | DELAY(rise), DELAY(fall) |
| | "OUT" | : output |
| | | DELAY(rise), DELAY(fall) |
| | "CTL" | : control input |
| | | DELAY(rise), DELAY(fall) |

6. NG_PRIMITIVE_CKBUF ("NEOCKBUF")

This is a clock buffer that copies its input to its output, with high drive capability. A CKBUF primitive is interpreted by architecture-specific technology mappers as a good candidate for placement in one of a device's clock buffers.

| Pins: | "IN" | : input |
| | | DELAY(rise), DELAY(fall) |
| | "OUT" | : output |
| | | DELAY(rise), DELAY(fall) |

7. NG_PRIMITIVE_FF ("NEOFF")

This is a rising edge triggered D flip-flop with asynchronous set and reset and clock enable. The clock enable is synchronous (e.g. it selects output data fed back through a data-input mux) and active high (feedback is selected when clock enable input is low). The asynchronous inputs are active high. The reset input is dominant over the set input.

| Pins: | "IN" | : data input |
| | | DELAY(rise), DELAY(fall), |
| | | SETUP(rise) to CLK(rise), |
| | | SETUP(rise) to CLK(fall) |
| | | SETUP(fall) to CLK(rise), |
| | | SETUP(fall) to CLK(fall) |
| | | HOLD(rise) to CLK(rise), |
| | | HOLD(rise) to CLK(fall) |
| | | HOLD(fall) to CLK(rise), |
| | | HOLD(fall) to CLK(fall) |
| | "OUT" | : data output |
| | | DELAY(rise), DELAY(fall) |
| | "CLK" | : clock input |
| | | DELAY(rise), DELAY(fall) |
| | "SET" | : asynchronous set input |
| | | DELAY(rise), DELAY(fall) |
| | | SETUP(rise) to CLK(rise), |
| | | SETUP(rise) to CLK(fall) |
| | | SETUP(fall) to CLK(rise), |
| | | SETUP(fall) to CLK(fall) |
| | | HOLD(rise) to CLK(rise), |
| | | HOLD(rise) to CLK(fall) |
| | | HOLD(fall) to CLK(rise), |
| | | HOLD(fall) to CLK(fall) |
| | "RST" | : asynchronous reset input |
| | | DELAY(rise), DELAY(fall) |
| | | SETUP(rise) to CLK(rise), |
| | | SETUP(rise) to CLK(fall) |
| | | SETUP(fall) to CLK(rise), |
| | | SETUP(fall) to CLK(fall) |
| | | HOLD(rise) to CLK(rise), |
| | | HOLD(rise) to CLK(fall) |
| | | HOLD(fall) to CLK(rise), |
| | | HOLD(fall) to CLK(fall) |
| | "CE" | ; clock enable input |
| | | DELAY(rise), DELAY(fall) |
| | | SETUP(rise) to CLK(rise), |
| | | SETUP(rise) to CLK(fall) |
| | | SETUP(fall) to CLK(rise), |
| | | SETUP(fall) to CLK(fall) |
| | | HOLD(rise) to CLK(rise), |
| | | HOLD(rise) to CLK(fall) |
| | | HOLD(fall) to CLK(rise), |
| | | HOLD(fall) to CLK(fall) |

8. NG_PRIMITIVE_LATCH ("NEOLATCH")

This is a level sensitive D latch with asynchronous set and reset and clock enable. The latch is see-through when the clock input is high. The asynchronous inputs are active high. The reset input is dominant over the set input.

| Pins: | "IN" | : data input |
| | | DELAY(rise), DELAY(fall) |
| | | SETUP(rise) to CLK(rise), |
| | | SETUP(rise) to CLK(fall) |
| | | SETUP(fall) to CLK(rise), |
| | | SETUP(fall) to CLK(fall) |
| | | HOLD(rise) to CLK(rise), |
| | | HOLD(rise) to CLK(fall) |
| | | HOLD(fall) to CLK(rise), |
| | | HOLD(fall) to CLK(fall) |
| | "OUT" | : data output |
| | | DELAY(rise), DELAY(fall) |
| | "CLK" | : clock input |
| | | DELAY(rise), DELAY(fall) |
| | "SET" | : asynchronous set input |
| | | DELAY(rise), DELAY(fall) |
| | | SETUP(rise) to CLK(rise), |
| | | SETUP(rise) to CLK(fall) |
| | | SETUP(fall) to CLK(rise), |
| | | SETUP(fall) to CLK(fall) |
| | | HOLD(rise) to CLK(rise), |
| | | HOLD(rise) to CLK(fall) |
| | | HOLD(fall) to CLK(rise), |
| | | HOLD(fall) to CLK(fall) |
| | "RST" | : asynchronous input |
| | | DELAY(rise), DELAY(fall) |
| | | SETUP(rise) to CLK(rise), |
| | | SETUP(rise) to CLK(fall) |
| | | SETUP(fall) to CLK(rise), |
| | | SETUP(fall) to CLK(fall) |
| | | HOLD(rise) to CLK(rise), |
| | | HOLD(rise) to CLK(fall) |
| | | HOLD(fall) to CLK(rise), |
| | | HOLD(fall) to CLK(fall) |

9. NG_PRIMITIVE_PULLUP ("NEOPU")

This is a pullup resistor. There is a single signal connection and an implied connection to logic one.

| Pins: | "OUT" | : signal connection |
|---|---|---|

10. NG_PRIMITIVE_PULLDOWN ("NEOPD")

This is a pulldown resistor. There is a single signal connection and an implied connection to logic zero.

| Pins: | "OUT" | : signal connection |
|---|---|---|

11. NG_PRIMITIVE_OSC ("NEOOSC")

This is an oscillator amplifier to which an external "tank" circuit is typically attached. It has an external input and output, and a clock output.

| Pins: | "IN" | ; external input |
|---|---|---|
| | "OUT" | : external output |
| | "CLK" | ; clock output |

12. NG_PRIMITIVE_PAD ("NEOPAD")

This is a device I/O pad.

| Pins: | "PAD" | : pad pin |
|---|---|---|

The type of pad (input, output, etc.) is indicated by the type of the PAD's pin.

13. NG_PRIMITIVE_ONE ("NEOONE")

This is a logic '1' generator. It is used to identify signals tied to VCC, VDD, etc.

| Pins: | "OUT" | : power output |
|---|---|---|

14. NG_PRIMITIVE_ZERO ("NEOZERO")

This is a logic '0' generator. It is used to identify signals tied to ground.

| Pins: | "OUT" | : ground output |
|---|---|---|

15. NG_PRIMITIVE_ROM ("NEOROMn")

This is read only memory. It is always one bit wide, but may have from 2 to 64 K address inputs. Note that the name NEOROMn implies n storage bits, so a NEOROM16 has 4 address inputs.

| Pins: | "CTLn" | : address inputs (many) DELAY(rise), DELAY(fall) |
|---|---|---|
| | "OUT" | : data output DELAY(rise), DELAY(fall) |

16. NG_PRIMITIVE_RAM ("NEORAMn")

This is read-write memory. It is always one bit wide, but may have from 2 to 64 K address inputs. The write enable input is active high. Note that the name NEORAMn implies n storage bits, so a NEORAM16 has 4 address inputs.

| Pins: | "CTLn" | : address inputs (many) DELAY(rise), DELAY(fall) SETUP(rise) to CLK(rise), SETUP(rise) to CLK(fall), SETUP(fall) to CLK(rise), SETUP(fall) to CLK(fall) HOLD(rise) to CLK(rise), HOLD(rise) to CLK(fall), HOLD(fall) to CLK(rise), HOLD(fall) to CLK(fall) |
|---|---|---|
| | "IN" | : data input DELAY(rise), DELAY(fall) SETUP(rise) to CLK(rise), SETUP(rise) to CLK(fall), SETUP(fall) to CLK(rise), SETUP(fall) to CLK(fall) HOLD(rise) to CLK(rise), HOLD(rise) to CLK(fall) HOLD(fall) to CLK(rise), HOLD(fall) to CLK(fall) |
| | "CLK" | : write enable input DELAY(rise), DELAY(fall) |
| | "OUT" | : data output DELAY(rise), DELAY(fall) |

Figure 8:
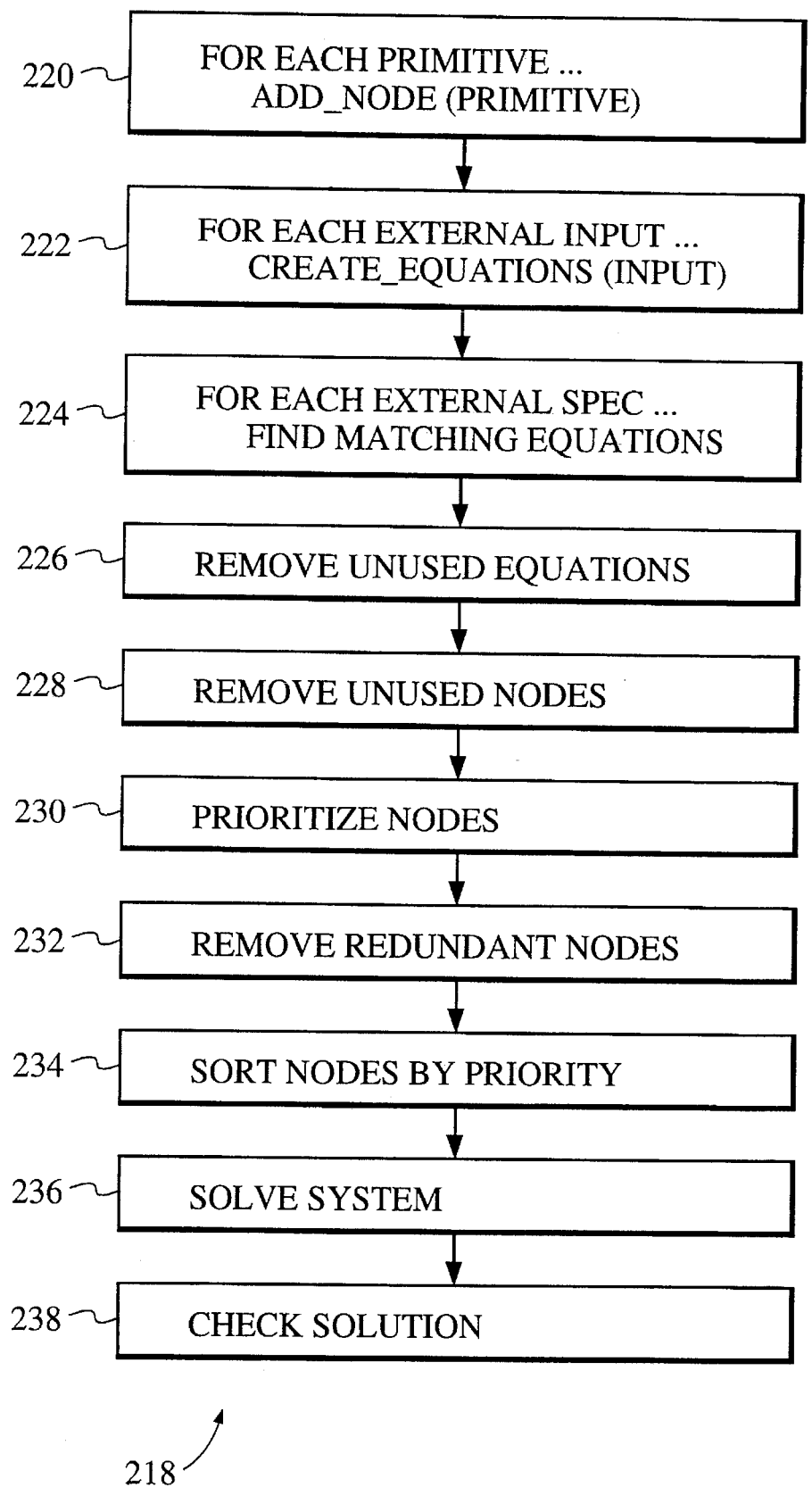
FIG. 8 is a top level flow diagram of the main program of the process of the present invention.

Top Level Flow Diagram:

FIG. 8 illustrates the general, top level flow 218 (also referred to as the main program) of the back-annotation process of converting external timing characteristics into timing constraints for each node of each primitive within the abstract representation of the circuit within the simulation. First, the process looks at each primitive within the circuit and for each pin on each primitive, creates 220 one or more nodes correlating to the type of pin on the primitive. Next, the process takes each external input to the circuit and traces a path across the circuit creating 222 an equation of nodes until all possible combinations of input-to-output paths and input-to-clock paths have been created. Following this, the process takes each external specification and matches 224 the specification to the corresponding equations created in the previous step of the process.

Next, the process removes 226 all equations that were unused. That is, those equations which were not successfully matched with an external specification are eliminated. Similarly, the process next removes 228 all nodes within the circuit which were not used in creating the equations. Next, the process prioritizes 230 the nodes or variables according to the following precedence guide:

1. Variables for pins given special positive weight;
2. SETUP and HOLD variables;
3. Variables for outputs of sequential elements;
4. Variables for all other primitive outputs;
5. Variables for primitive inputs; and
6. Variables for pins given special negative weight.

The linear system of equations is in the form of rows and columns where each row represents a separate equation and each column represents a node common to each equation. Thus, prioritizing the nodes inherently involves prioritizing the columns.

Next, the process detects and removes 232 redundant nodes. These nodes include those variables which have the same co-efficient in all equations. This may occur when the abstract representation of the circuit contains buffers or inverters, or simple connections between primitives, also known as nets, that have a single driver and a single load. The following list enumerates all sets of redundant nodes in the example of the circuit of FIG. 6.

1. AND:OUT is redundant with OR1:I1;
2. XOR:OUT is redundant with OR1:I2; and
3. OR2:OUT is redundant with FF:R.

Whenever redundant nodes are detected, the node with the highest priority as defined by the precedence guide described above is preserved, and all others in the redundancy set are eliminated. After the nodes have been prioritized and the redundant ones removed, the nodes (columns) are then sorted 234 to place the highest priority node at or near the beginning of each equation with the remaining nodes in descending order of priority in the equation.

After this is done, the linear system of equations are solved 236 by any known means of solving linear equations. One example of a known means for solving such equations is disclosed in "Numerical Recipes in C: The Art of Scientific Computing" written by William H. Press, Brian P. Flannery, Saul A. Teukolsky and William T. Vetterling, published by the Press Syndicate of The University of Cambridge, pp. 28–46 (1990).

Once the solution has been obtained, the solution is checked to eliminate negative values where they are prohibited. For example, negative values at delay nodes are prohibited. When a negative value is detected, the column corresponding to that negative node is permuted with any other column corresponding to another negative node and then the system is again solved. This process is repeated as necessary until a non-negative solution is obtained.

The above described logic flow may also be understood with respect to the following pseudocode representation.

```
// main entry point
mains ( ) {
    for each primitive
        add_nodes(primitive)
    for each external input
        for each corresponding primitive input
            create equation (type = DELAY,
                             source_pin = external input,
                             initial_edge = RISE,
                             final_edge = RISE)
            traverse_primitive(equation, input_in)
            create equation (type = DELAY,
                             source_pin = external input,
                             initial_edge = FALL,
                             final_edge = FALL)
            traverse_primitive(equation, input_pin)
    for each external spec
        for each equation
            if match_equation(equation, external spec)
                equation.external_spec = external spec
    remove all equations without matching specs
    remove all nodes that are not used in any equation
    prioritize nodes
    remove redundant nodes // save higher priority, remove
                                                    lower
    sort nodes by priority
    solve system
    check solution // illegal negative values or out of
                      range values
```

Data Structures

Figure 9:
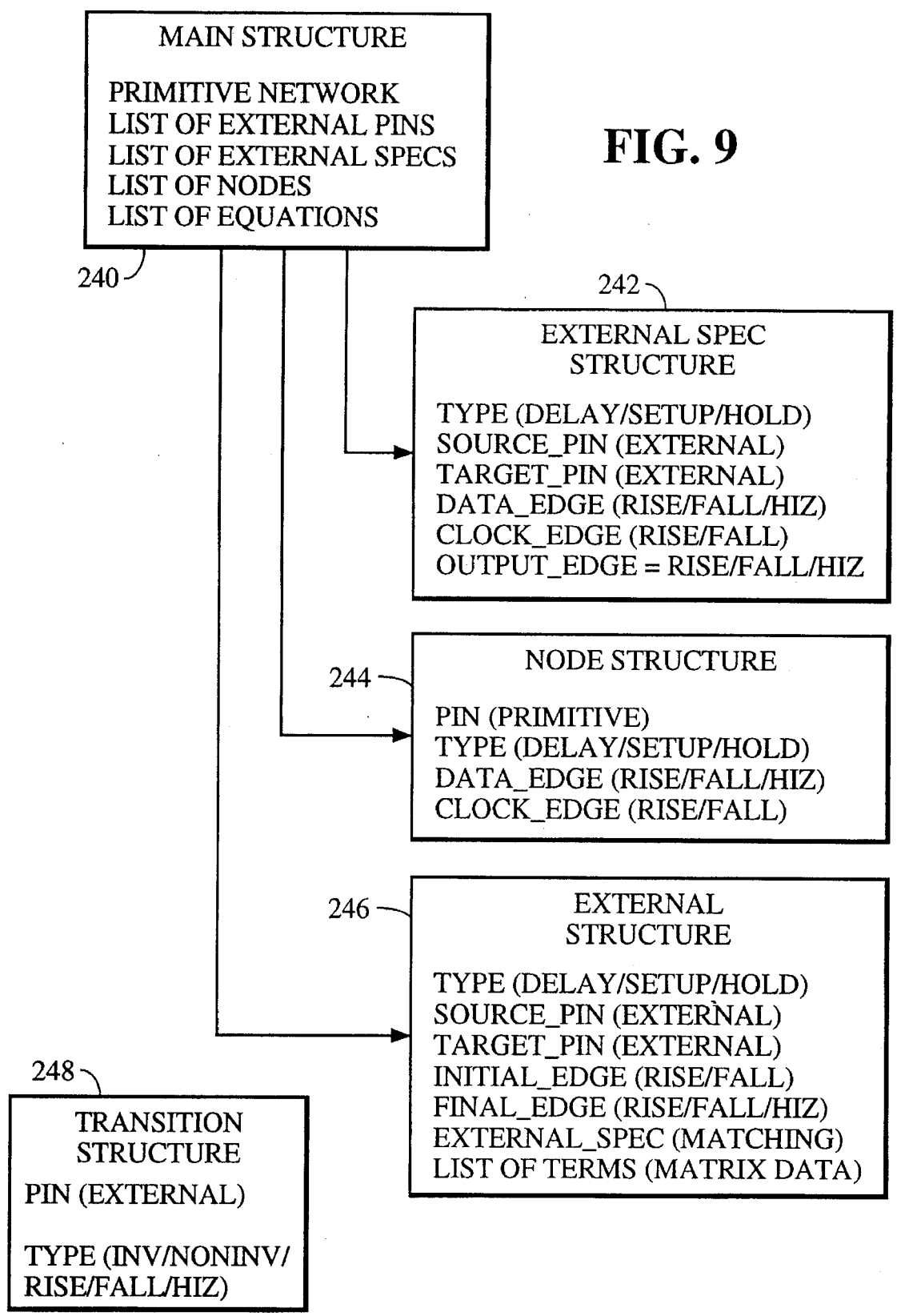
FIG. 9 is a representation of the data structures of the data and arguments of the present invention.

Referring to FIG. 9, it can be seen that the relevant data relating to the primitives described above has the following structure and arguments. A main structure 240 includes a network of primitive elements, a list of external pins to the cell in the FPGA circuit, a list of external specifications for each cell, a list of nodes within the designer's abstract representation of the circuit, and a list of equations which are obtained by traversing the abstract representation of the circuit through the primitives.

A structure 242 for the external specifications includes three common data fields and up to one or two additional data fields. Each specification includes a first field which is the type of specification. This type may be a DELAY, a SETUP, or a HOLD type of specification. Each external specification also has a field denoting the source pin for the specification. This is simply the external pin on the cell for the input portion of the external specification. Each external specification also has a field for the target pin. This is simply the external pin on the cell which is either an output pin for a DELAY or a clock pin in the case of SETUP/HOLD.

The additional fields are as follows. For SETUP and HOLD type external specifications there is a field for the clock edge which may have a value of RISE or FALL. In addition, there is a data edge field which may have a value of RISE or FALL. In the case of a DELAY type external specification, there is an output edge field having possible values of RISE, FALL or HIZ.

The node data structure 244 includes four data fields. These are: pin, type, data_edge, and clk_edge. The pin field contains the primitive pin on which the node is defined. The type of node can be DELAY, SETUP, or HOLD. The data_edge can be RISE, FALL or HIZ. The clock edge (which only applies to SETUP and HOLD type nodes) can be RISE or FALL.

The equation data structure 246 includes seven data fields. These data fields are type, source_pin, target_pin, initial_edge, final_edge, external_spec, and list of terms. The type data field has possible values of DELAY, SETUP, or HOLD. The source_pin data field specifies the external pin on the cell, which in all cases is an input pin to the cell. The target_pin specifies an external pin to the cell which in the case of a delay type equation is an output pin and in the case of a SETUP or HOLD type equation is a clock pin. The initial_edge data field specifies whether the equation involves a rising or falling edge at the source pin. The final_edge data field specifies whether the equation involves a rising or falling edge or a high impedance at the target pin. The external spec data field includes the numeric value of the DELAY/SETUP/HOLD specification, expressed in units of time. The list of terms data field includes the co-efficients for each node, which may be set equal to 0, +1, or −1.

Lastly, the transition data structure 248 includes two data fields, pin and type. The pin data field specifies the reachable pin on the primitive. The type data field specifies whether the transition is INVERTING, NON-INVERTING, RISE, FALL, or HIZ.

The above described data structures may also be understood with respect to the following pseudocode representation.

Main Structure:
primitive network

| | |
|---|---|
| list of external pins | // each is correlated to one |
| | // or more pins on primitives |
| | // in the network |
| list of external specs | // DELAY/SETUP/HOLD spec in |
| | // terms of external pins |
| list of nodes | // DELAY/SETUP/HOLD |
| | // attributes on primitive |
| | // pins to solve for |
| list of equations | // constraints built from |
| | // external specs |

Equation Structure:

| | |
|---|---|
| type | // DELAY, SETUP, or HOLD |
| source_pin | // external pin (input pin |
| | // for all types) |
| target_pin | // external pin (output pin |
| | // for DELAY, clock pin for |

```
initial_edge        // SETUP/HOLD types)
final_edge          // RISE/FALL at source_pin
                    // RISE/FALL/HIZ at
                    // target_pin
external_spec       // numeric value of
                    // DELAY/SETUP/HOLD spec
list of terms       // coefficients for each
                    // node, set to 0, +1, or −1
Node Structure:

pin                 // primitive pin
type                // DELAY, SETUP, or HOLD
data_edge           // RISE/FALL/HIZ
clk_edge            // RISE/FALL (for SETUP/HOLD
                    // only)
Transition Structure:

pin                 // reachable pin on primitive
type                // INVERTING/NONINVERTING/
                    // RISE/FALL/HIZ
External specification:

type                // DELAY, SETUP, or HOLD
source pin          // external pin, as in
                    // equation
target pin          // external pin, as in
                    // equation
if (SETUP/HOLD)
clock edge          // RISE/FALL
data edge           // RISE/FALL
else // DELAY/HIZ
output edge         // RISE/FALL/HIZ
```

Create_Equations

Figure 10:
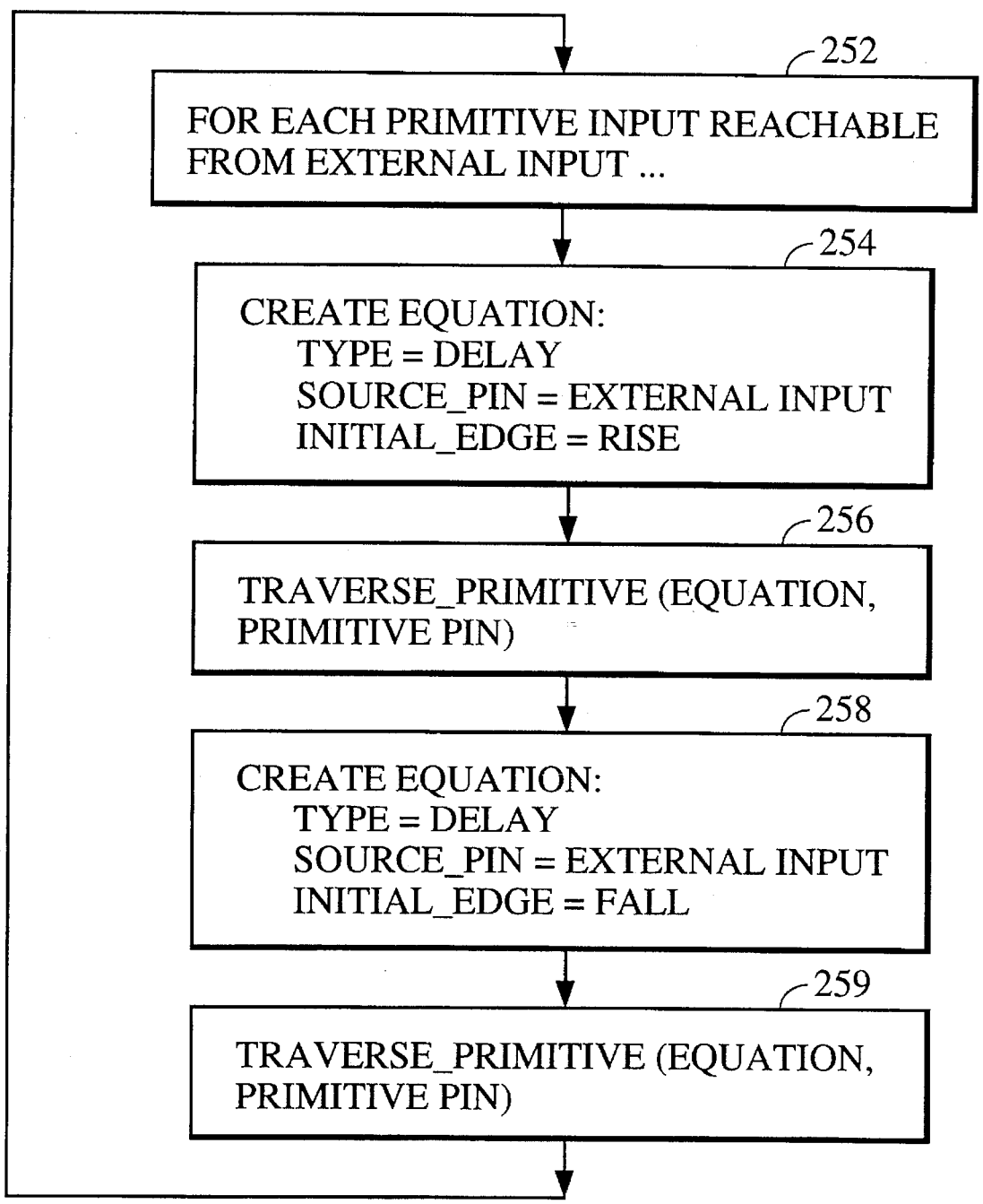
FIG. 10 is a flow diagram of the create_equation portion of the main program.

The create_equations flow chart of FIG. 10 is actually a subset of the main flow chart of FIG. 8. This logic creates an equation for each input-to-output path for DELAY constraints and each input-to-clock path for SETUP/HOLD constraints.

As can be appreciated, the create_equations function 250 is performed 252 for each primitive input which is reachable from the external input. An equation is created 254 in which the type data field is initially set equal to DELAY, the source_pin data field is set equal to the external input pin and the initial_edge is set equal to RISE. The traverse_primitive function described below is next called 256 to determine each of the output pins to which this input pin is related. Create_equation is again then performed 258 to create an equation with initial_edge set equal to FALL. The traverse_primitive function is then called 259 to determine the output pins to which this input pin is related. After that, the process returns to the beginning 252 so that the next primitive input reachable from the external input can have an equation created for it.

Add_Nodes

Figure 11A:
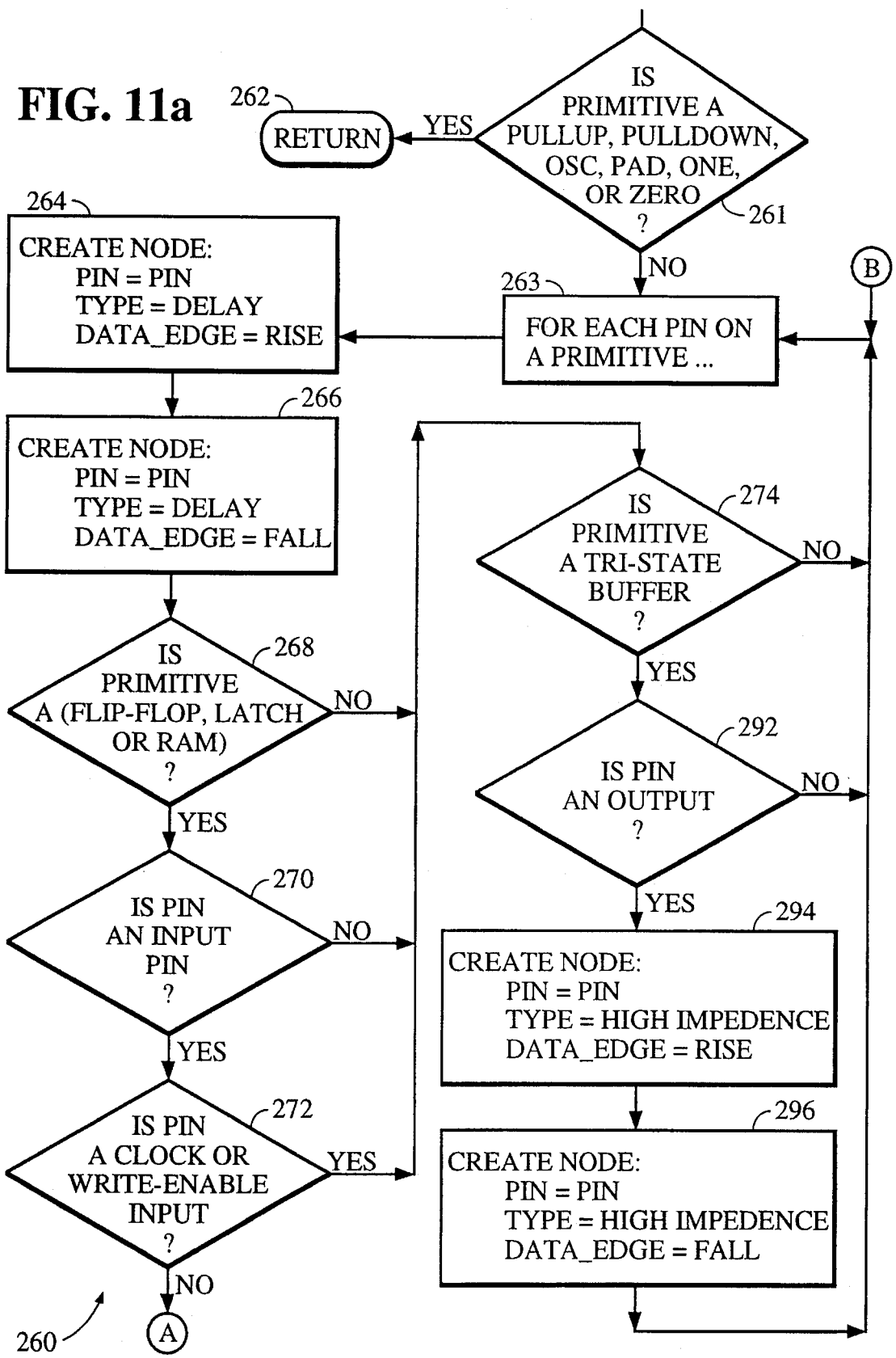
FIG. 11a and 11b are a flow diagram of the process known as add_node.
Figure 11B:
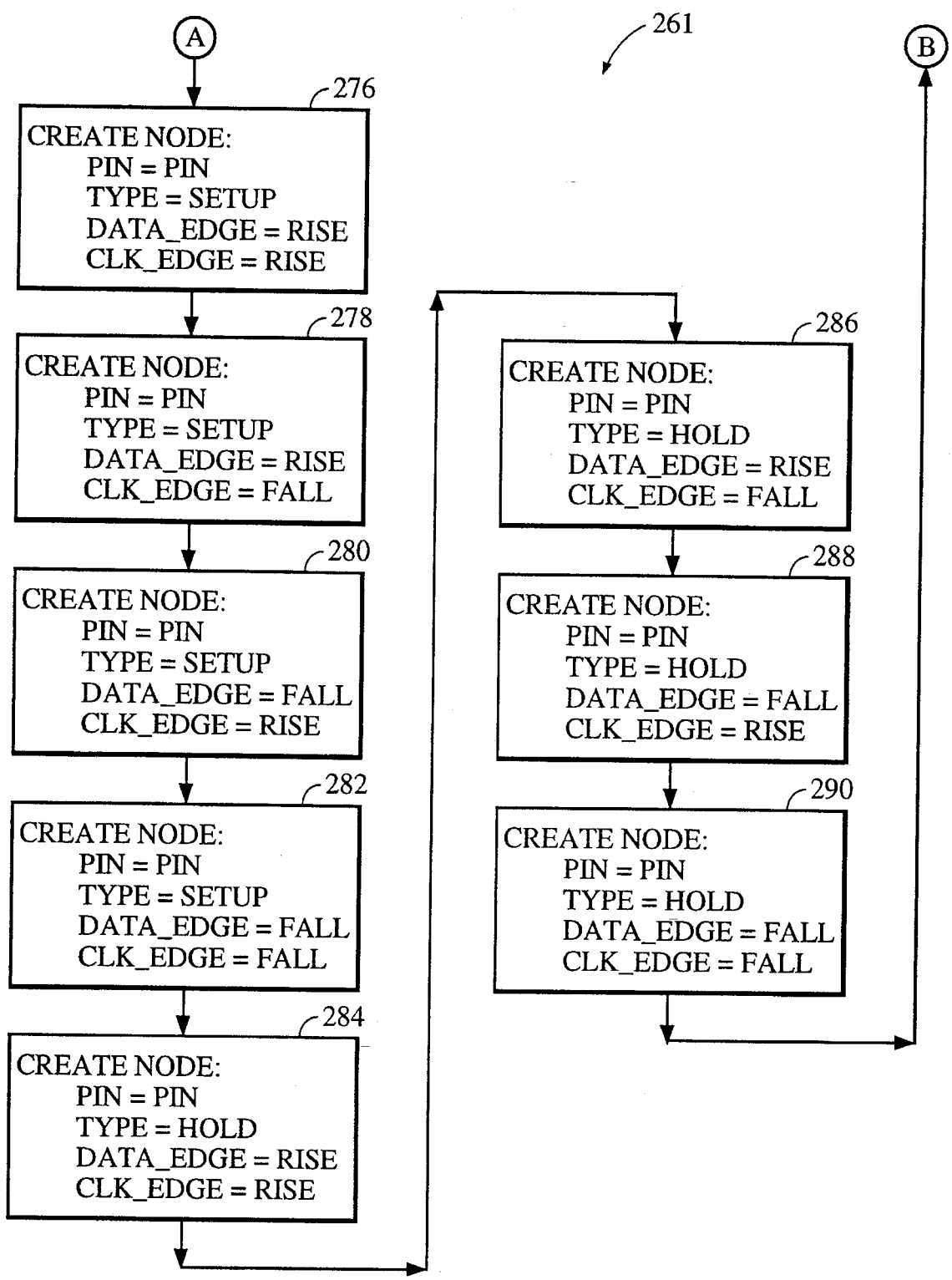

An add_nodes function 260, shown in FIGS. 11a and 11b, is called by the main program 218 described above. Generally, this function adds one or more nodes to the system for each pin of each primitive.

First, the primitive is tested 261 to see if it is one to be ignored (PULLUP, PULLDOWN, OSC, PAD, ONE, or ZERO). If so, then the process returns 262. If not, then the following logic will be performed for each pin on a primitive 263.

The node created 264 for each pin includes the pin data field set equal to that pin value, the type set equal to the DELAY type node, and the data_edge set equal to RISE.

Next, another nearly identical node is created 266 with the difference that the data_edge is a FALL instead of a RISE. Next, a test 268 is performed to see if the primitive on which this function is being performed is a flip-flop, latch or RAM. If the result from the test is yes, a second test 270 is performed to determine if the pin is an input pin to the primitive. If the answer to this test is yes as well, a third test 272 is performed to see if the pin is a clock or write-enable input. If the answer to the third test 272 is no, then eight nodes will be created for the pin as described below. If the answer to either of the first two tests 268 and 270 is no or the answer to the third test is yes, the primitive will be tested 274 to determine if it is a tri-state buffer as discussed below.

In the case of an input pin on a flip-flop, latch, or RAM which is not a clock or write-enable input the following eight nodes are created 276, 278, 280, 282, 284, 286, 288 and 290. For each of the eight nodes the pin data field is set equal to the pin of the primitive. For the first four nodes 276, 278, 280 and 282 the type field is set equal to SETUP and for the last four nodes 284, 286, 288 and 290 the type field is set equal to HOLD. For each of the four SETUP nodes a different combination of RISE and FALL on the data_edge and clock_edge are provided. Thus, the first node 276 has a RISE/RISE, the second node 278 has a RISE/FALL, the third node 280 has a FALL/RISE and the fourth node 282 has a FALL/FALL. Similarly, for the four HOLD nodes the four combinations of RISE and FALL are provided. The process then returns to the beginning.

If the previously mentioned test 274 for a tri-state buffer is failed, the process returns to the beginning 262 so that the next pin on the primitive may have nodes created for it. If the test 274 for the tri-state buffer is positive, another test 292 is performed to determine if the pin is an output pin. If not, the process similarly returns to the beginning 262 to create nodes for the next pin on the primitive. However, if the determination is made that the pin is an output pin, then a node is created 294 where the pin data field is set equal to that pin, the type data field is set to high impedance (HIZ), and the data_edge is set to RISE. Similarly, a second node is created 296 for that pin in which the pin is set equal to the pin, the type is set to high impedance and the data_edge is set to FALL. After this, the process returns to the beginning 262 to create nodes for the next pin.

The above-described process flow may also be understood with respect to the following pseudocode representation.

```
// add nodes to the system for a primitive
add_nodes (primitive) {
    if   (primitive is a PULLUP, PULLDOWN, OSC, PAD,
          ONE or ZERO)
         return
    for each pin on primitive
         create node    (pin = pin, type = DELAY,
                         data_edge = RISE)
         create node    (pin = pin, type = DELAY,
                         data_edge = FALL)
         if ((primitive is FF, LATCH, or RAM) &&
             (pin is an input) &&
             (pin is not clock/write-enable))
              create node    (pin = pin, type = SETUP,
                              data_edge = RISE,
                              clk_edge = RISE)
              create node    (pin = pin, type = SETUP,
                              data_edge = RISE,
                              clk_edge = FALL)
              create node    (pin = pin, type = SETUP,
                              data_edge = FALL,
                              clk_edge = RISE)
              create node    (pin = pin, type = SETUP,
```

```
            data_edge = FALL,
            clk_edge = FALL)
create node (pin = pin, type = HOLD,
            data_edge = RISE,
            clk_edge = RISE)
create node (pin = pin, type = HOLD,
            data_edge = RISE,
            clk_edge = FALL)
create node (pin = pin, type = HOLD,
            data_edge = FALL,
            clk_edge = RISE)
create node (pin = pin, type = HOLD,
            data_edge = FALL,
            clk_edge = FALL)
if ((primitive is TRISTATE) && (pin is output))
    create node (pin = pin, type = HIZ,
                data_edge = RISE)
    create node (pin = pin, type = HIZ,
                data_edge = FALL)
```

Traverse_Primitive

Figure 12:
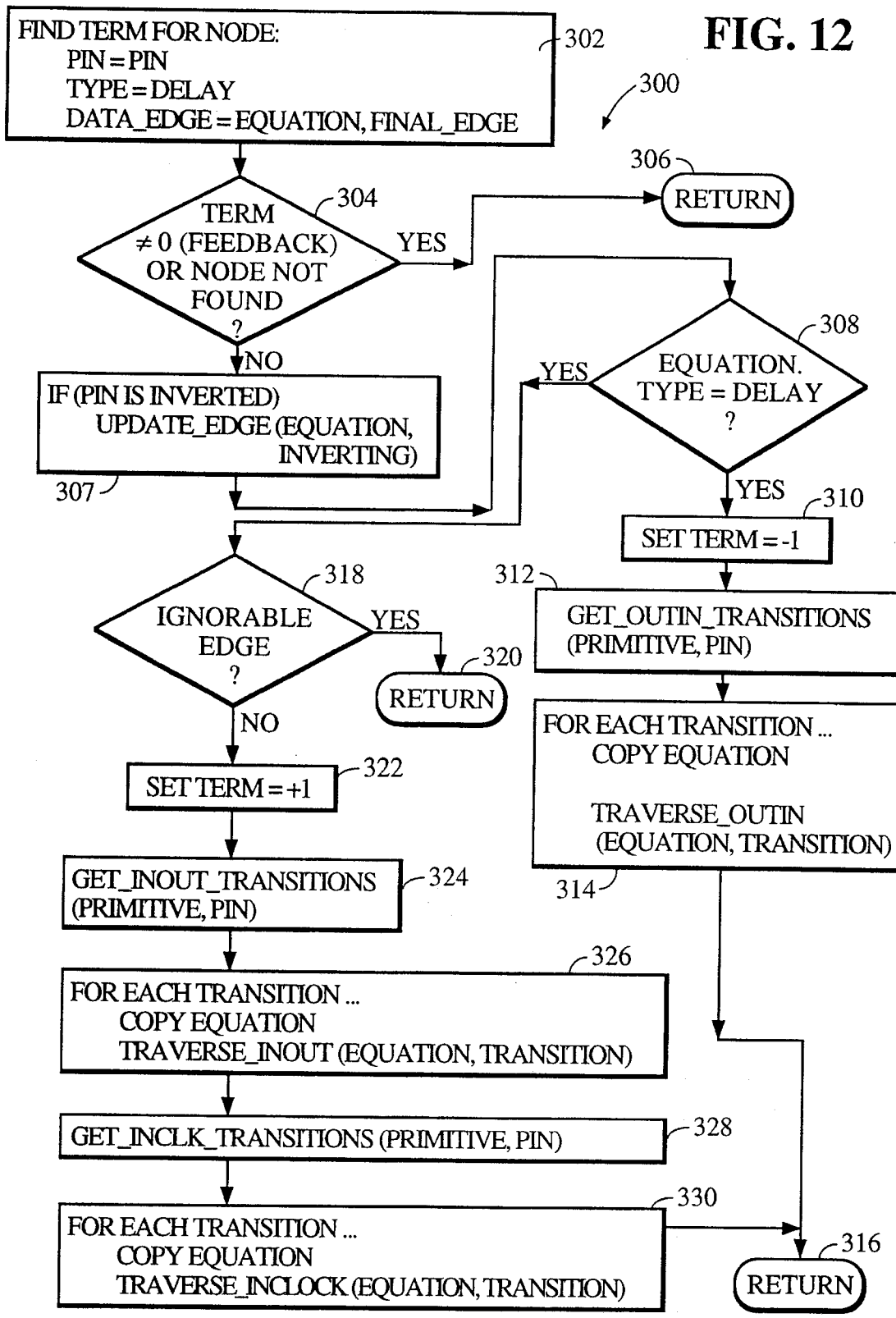
FIG. 12 is a flow diagram of the process known as traverse_primitive.

A traverse_primitive function 300, shown in FIG. 12, is called by the main program 218 to continue creating the equation across the circuit. This function serves to traverse a primitive from an input to its output and to its clock input, or from its output to its inputs. While traversing, this function calls other functions which add terms to or copy the equation.

First the term is found 302 for the node having the pin equal to the pin for which the traverse_primitive function was called, having the type equal to DELAY and having the data_edge equal to the value of the final_edge of the equation. Once this term is found, it is tested 304. If the term is not equal to zero, then this node has already been visited and a feedback path has been detected. Accordingly, the process ends the traverse_primitive function and returns 306. If the node is not found, then this is an ignorable primitive (PULLUP, PULLDOWN, OSC, PAD, ONE OR ZERO). In that case, the process also returns 306. Otherwise, if the term is equal to zero a test 307 is performed to determine if the pin is inverted. If it is, then the update_edge function described below is called. Next, a test is performed 308 to determine if the type of equation is equal to DELAY. If it is not, a DELAY equation the term is set 310 equal to −1 and a get_outin_transitions function described below is called 312 to determine the proper pin on the primitive to traverse to. Next, 314 for each such transition the current equation is copied and the traverse_outin function is called to continue traversing. At this time, the process returns 316 after completing the traverse_primitive function.

However, if the equation type is DELAY then a test 318 is made to see if the edge is an ignorable edge. To do this the final_edge of the equation is tested to see if it is not equal to RISE and if the pin is either an asynchronous set, an asynchronous reset or a clock input. In other words, since these input pins only react to rising edges, falling edges are of no interest. In this case, the process has completed the traverse_primitive function and returns 320. If not (it is not an ignorable edge), then the term is set 322 equal to +1 and the get_inout_transitions function described below is called 324. Next, for each transition found by the get_inout_transitions function the current equation is copied and the traverse_inout function described below is called 326. Next, the get_inclk_transitions function described below is called 328. For each such transition found the current equation is copied and the traverse_inclk function described below is called 330. After this, the traverse_primitive function is completed and the process returns 316.

The above-described process flow may also be understood with respect to the following pseudocode representation.

```
// traverse a primitive in the network, starting at a given
//     pin
traverse_primitive (equation, pin) {
    find node (pin=pin, type=DELAY, data_edge =
                equation.final_edge)
    if (node not found)
        return
    if (equation.term[node] ≠ 0) // feedback
        return
    if (pin is inverted)
        update_edge(equation, INVERTING)
    if (equation.type is DELAY)
        if (equation.final_edge ≠ RISE)
            if (pin is async set, async reset, or clock
                    input)
                return; // insignificant edge
        equation.term[node] = +1
        get_inout_transitions(primitive, pin)
        for each transition
            new_equation = copy(equation)
            traverse_inout(new_equation, transition)
        get_inclock_transitions(primitive, pin)
        for each transition
            new_equation = copy(equation)
            traverse_inclock(new_equation,
                            transition,
                            pin)
    else { // SETUP/HOLD
        equation.term[node] = −1
        get_outin_transitions(primitive, pin)
        for each transition
            new_equation = copy(equation)
            traverse_outin(new_equation,
                            transition)
```

Get_inout_Transitions

Figure 13A:
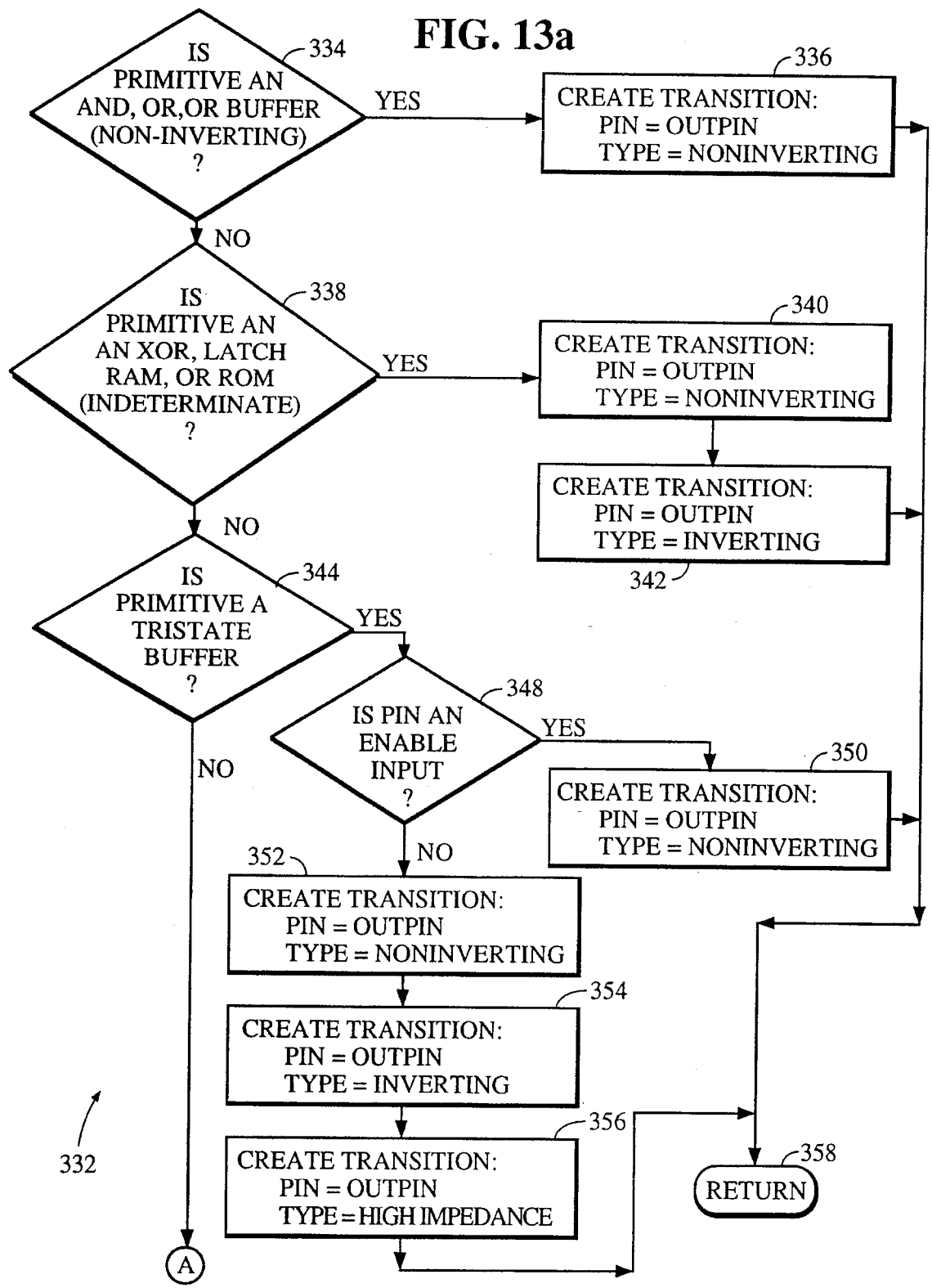
FIGS. 13a and 13b are a flow diagram of the process known as get_inout_transitions.
Figure 13B:
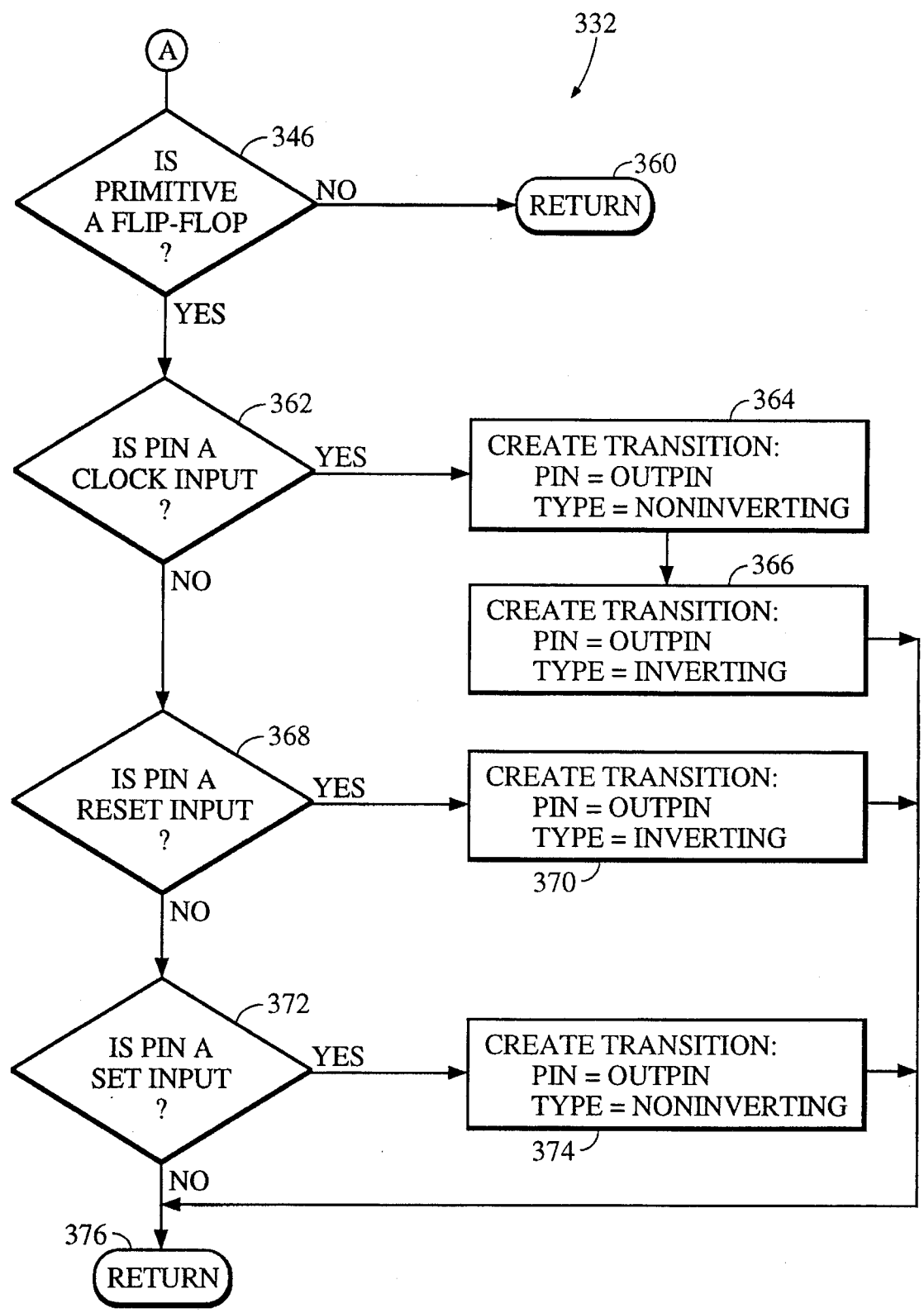

The get_inout_transitions function 332, shown in FIGS. 13a and 13b, is called from the traverse_primitive function 300. It finds all of the input-to-output transitions which are possible from a given input of this type of primitive.

The first test 334 in the function is to determine if the primitive is an AND, OR, or BUFFER gate. In each of these cases, the gate is noninverting so that the output will not be inverted from the input. Accordingly, if the test 334 is positive, a transition is created 336 having the pin equal to the output pin and the type equal to NONINVERTING. However, if the test 334 is negative then a second test 338 is performed to see if the primitive is an exclusive or (XOR), LATCH, RAM, or ROM. If the test 338 is positive, then two transitions are created 340 and 342. Two transitions are created since for each of those primitives the output transition is indeterminate from the input transition. Each has the pin equal to the output pin and the type for one transition is NONINVERTING and for the other transition is INVERTING. If this second test 338 is negative, then a third test 344 is performed to determine if the primitive is a tri-state buffer. If it is not, then a test 346 further described below is performed to determine if the primitive is a flip-flop.

However, if the primitive is a tri-state buffer then a test 348 is performed to determine if the pin is an enable input. If it is, then a transition is created 350 with the pin equal to the output pin and the type equal to NONINVERTING. However, if the pin is not an enable input then three transitions are created 352, 354 and 356 each with the pin equal to the output pin. Each of the three transitions has a different type. One is NONINVERTING, one is INVERTING and the third is high impedance (HIZ). After the transitions are created for the noninverting gates, the indeterminate primitives or the tri-state buffer, the process returns 358 to the function which called get_inout_transitions.

If the previously discussed test 346 to determine if the primitive is a flip-flop is negative, then the process returns 360 since the primitive must be one other than that tested for and is not of interest. However, if the primitive is a flip-flop, then another test 362 is performed to see if the pin is a clock input. If it is, then two transitions 364 and 366 are created each having the pin equal to the output pin and one having a NONINVERTING type and the second having an INVERTING type. However, if the pin is not a clock input, then a test 368 is performed to see if the pin is a reset input. If it is, then a single transition is created 370 with the pin equal to the output pin and the type being equal to INVERTING. If the pin is not a reset input, then a test 372 is performed to see if the pin is a set input. If it is, then a single transition is created 374 with the pin equal to the output pin and the type equal to NONINVERTING. After each of these types of transitions which are created 364, 366, 368 and 370 from the flip-flop, the process returns 376.

The above-described process flow may also be understood with respect to the following pseudocode representation.

```
// get all primitive transitions for input → output paths
get_inout_transitions(primitive, inpin) {
    if (primitive is AND/OR/BUF)
        create transition(outpin, NONINVERTING)
    else if (primitive is XOR, LATCH, RAM, or ROM)
        create transition(outpin, NONINVERTING)
        create transition(outpin, INVERTING)
    else if (primitive is TRI)
        if (pin is enable input)
            create transition(outpin, NONINVERTING)
        else
            create transition(outpin, NONINVERTING)
            create transition(outpin, INVERTING)
            create transition(outpin, HIZ)
    else if (primitive is FF)
        if (pin is clock input)
            create transition(outpin, NONINVERTING)
            create transition(outpin, INVERTING)
        else if (pin is reset input)
            create transition(outpin, INVERTING)
        else if (pin is set input)
            create transition(outpin, NONINVERTING)
```

Traverse_Inout

Figure 14:
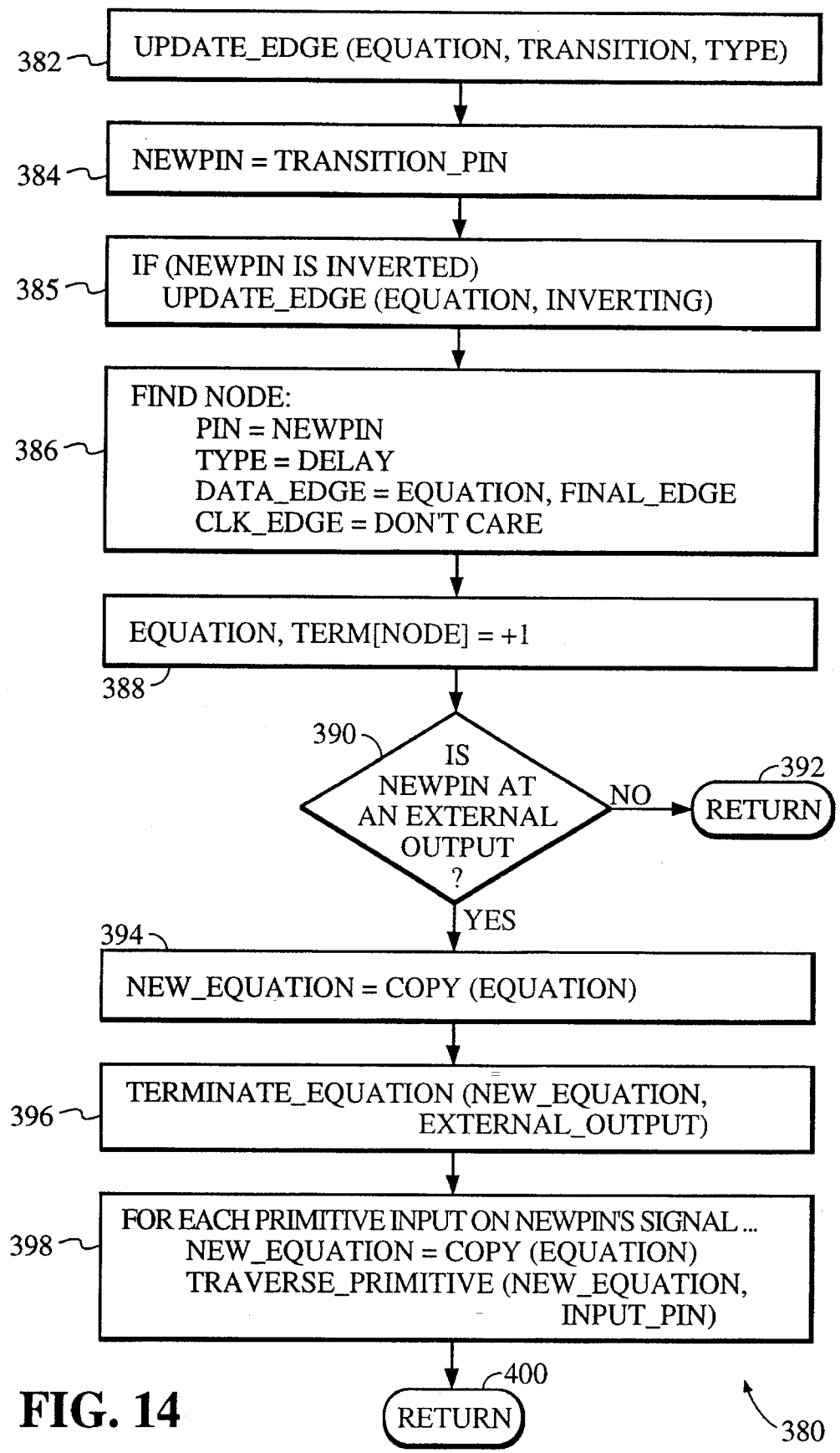
FIG. 14 is a flow diagram of a process known as traverse_inout.

The next function called by the traverse_primitive function 300 is the traverse_inout function 380, shown in FIG. 14. This function traverses a primitive from a given input to a given output and adds terms to and creates new equations as necessary for each input to output transition.

First, the function calls 382 the update_edge function described further below which updates the final edge of the equation based on the type of transition. Next, a variable, newpin, is used to store 384 the value of the pin of the transition of interest. If the newpin is inverted, then the update_edge function described below is called 385. Next, the node having the pin equal to this newpin, having a DELAY type, and having a data edge equal to the final_edge of the equation is found 386. The clock_edge data field of the node is not looked at, because it is a don't care condition. Next, the term of the equation for this node is set 388 equal to +1. Next, a test 390 is made to determine if newpin is at an external output of the circuit. If it is not, then the traverse_inout function is completed and the process returns 392 to the function which called it.

However, if the external output has been reached, then the equation is copied 394 into a variable called new_equation. Next, the terminate_equation function described further below is called 396. After this, for each primitive input which is connected to newpin, the equation is copied into the previously described variable new_equation and the traverse_primitive function is called for this new_equation 398. After this is completed, the process returns 400 to the function which called this function.

The above-described process flow may also be understood with respect to the following pseudocode representation.

```
// traverse a primitive on a given input → output
// transition
traverse_inout(equation, transition) {
    update_edge(equation, transition.type)
    newpin = transition.pin
    if (newpin is inverted)
        update_edge(equation, INVERTING)
    find node (pin=newpin, type=DELAY, data_edge =
               equation.final_edge
    equation.term[node]= +1
    if (newpin at external output)
        new_equation = copy(equation)
        terminate_equation(new_equation, external_output)
    for each primitive input on newpin's signal
        new_equation = copy(equation)
        traverse_primitive(new_equation, input_pin)
```

Get_inclock_transitions

Figure 15:
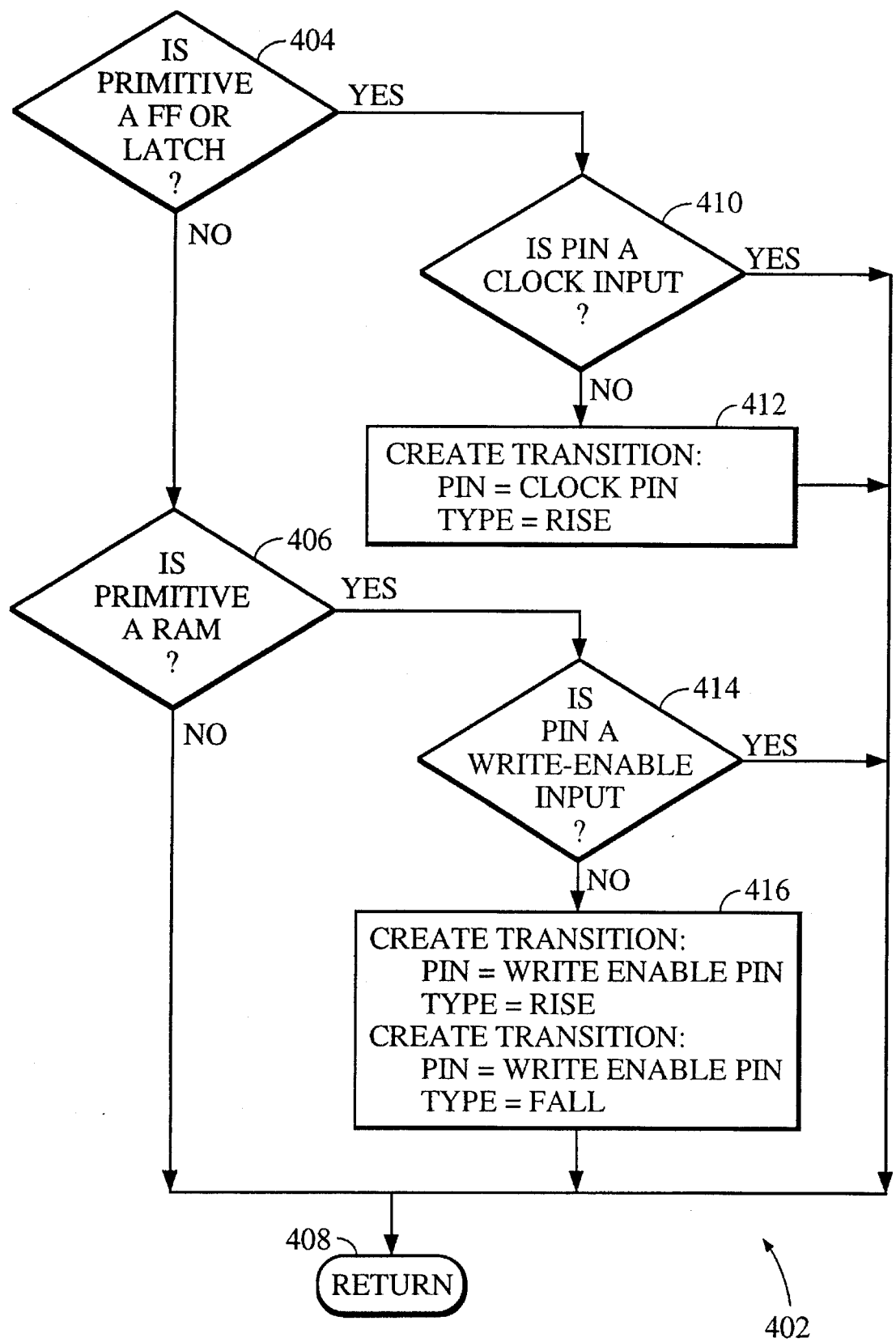
FIG. 15 is a flow diagram of a process known as get_inclock_transitions.

The traverse_primitive function 300 next calls the get_inclock_transitions function 402, shown in FIG. 15. This function finds all data input to clock input transitions through a primitive. This only is necessary if the primitive is a RAM, FF or LATCH.

First, the process tests 404 to see if the primitive is a flip-flop or a latch. If the determination is negative, then a test 406 is made to determine if the primitive is a RAM. If the determination is again negative, this indicates that the primitive is not a sequential primitive and that there are no clock transitions of interest, so the process returns 408 to the function which called this function. If the previously-discussed test 404 for a flip-flop or latch is positive, then a test 410 is made to see if the pin is a clock input. If it is, then the process returns 408 to the function which called this function. If it is not a clock input, then a transition is created 412 in which the pin equals clockpin and the type equals RISE. The process is then returned 408 to the function which called this function. If a positive determination was made when the process tested to determine if the primitive was a RAM, then a test 414 is performed to determine if the pin is a write-enable input. If it is, then the process returns 408 to the function which called this function. Otherwise, two transitions are created 416, each having the pin set equal to writeenablepin, with one having a RISE type and the other having a FALL type. After this, the process returns 408 to the function which called this function.

The above-described process flow may also be understood with respect to the following pseudocode representation.

```
// get all primitive transitions for input → clock paths
get_inclock_transitions(primitive, inpin) {
    if (primitive is FF or LATCH)
```

```
        if (pin is not clock input)
                create transition(clockpin, RISE)
        else if (primitive is RAM)
                if (pin is not write enable input)
                        create transition(writeenablepin, RISE)
                        create transition(writeenablepin, FALL)
```

Traverse_inclock

Figure 16:
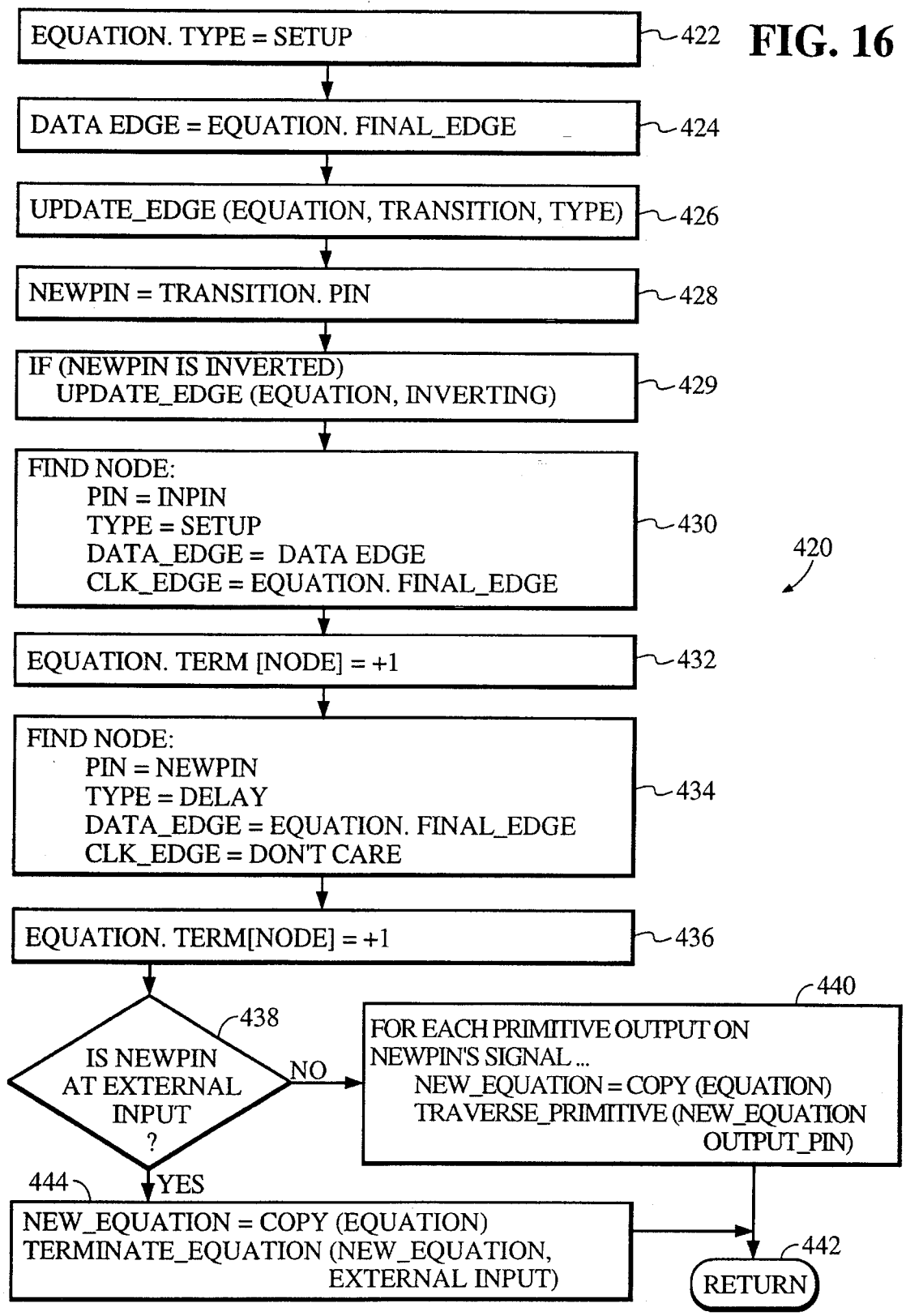
FIG. 16 is a flow diagram of a process known as traverse_inclock.

The next function called by the traverse_primitive function 300 is the traverse_inclock function 420, shown in FIG. 16. This function traverses a primitive from the given input to the clock input, converting the equation to a SETUP type and adding terms to and duplicating the equation as necessary for each input to clock transition.

First, the type of equation is set 422 equal to SETUP. Next, a variable, dataedge, is set 424 equal to the value of the final_edge data field of the equation. Next, the update_edge function described below is called 426. After this, the value of the pin of the transition is stored 428 into the variable newpin. If the newpin is inverted, then the update_edge function described below is called 429. After this, the node having a pin equal to inpin, having a SETUP type, having a data_edge equal to dataedge and having a clock_edge equal to the final_edge of the equation, is found 430. The term of the equation corresponding to this node is then set 432 to +1. Next, the node is found 434 having a pin equal to newpin, having a DELAY type, having a data_edge equal to the final_edge of the equation and with the clock_edge data field being a don't care condition. The term of the equation corresponding to this node is set 436 equal to +1. Next, a test 438 is performed to determine if the newpin is at an external input. If it is not, then for each primitive output connected to newpin, the equation is copied and stored into a variable entitled new_equation and the traverse_primitive function described above is called 440. After this, the process returns 442 to the function which called this function. However, if the newpin is at an external input, then similarly, the equation is copied into the new_equation variable and the terminate_equation function described below is called 444. After this, the process returns 442 to the function which called this function.

The above-described process flow may also be understood with respect to the following pseudocode representation.

```
// traverse a primitive on a given input → clock transition
traverse_inclock(equation, transition, inpin) {
    equation.type = SETUP
    dataedge = equation.final_edge
    update_edge(equation, transition.type)
    newpin = transition.pin
    if (newpin is inverted)
        update_edge(equation, INVERTING)
    find node (pin=inpin, type=SETUP, dataedge=data_edge,
            clk_edge=equation.final_edge)
    equation.term[node] = +1
    find node (pin=newpin, type=DELAY, data_edge =
            equation.final_edge)
    equation.term[node] = +1
    if (newpin at external input)
        new_equation = copy(equation)
        terminate_equation(new_equation, external_input)
    for each primitive output on newpin's signal
        new_equation = copy(equation)
        traverse_primitive(new_equation, output_pin)
```

Get_outin_transitions

Figure 17A:
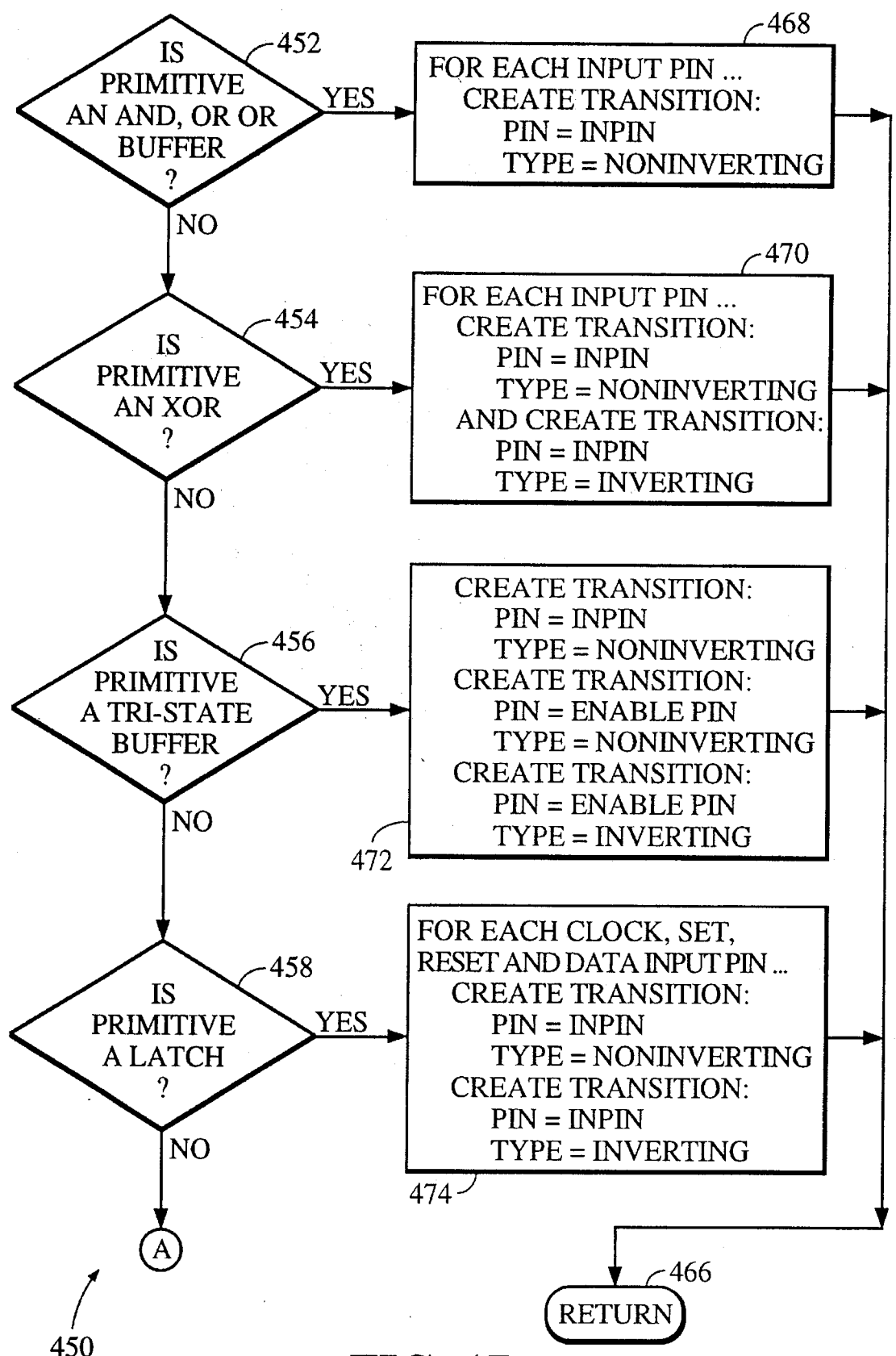
FIG. 17a and 17b are a flow diagram of a process known as get_outin_transitions.
Figure 17B:
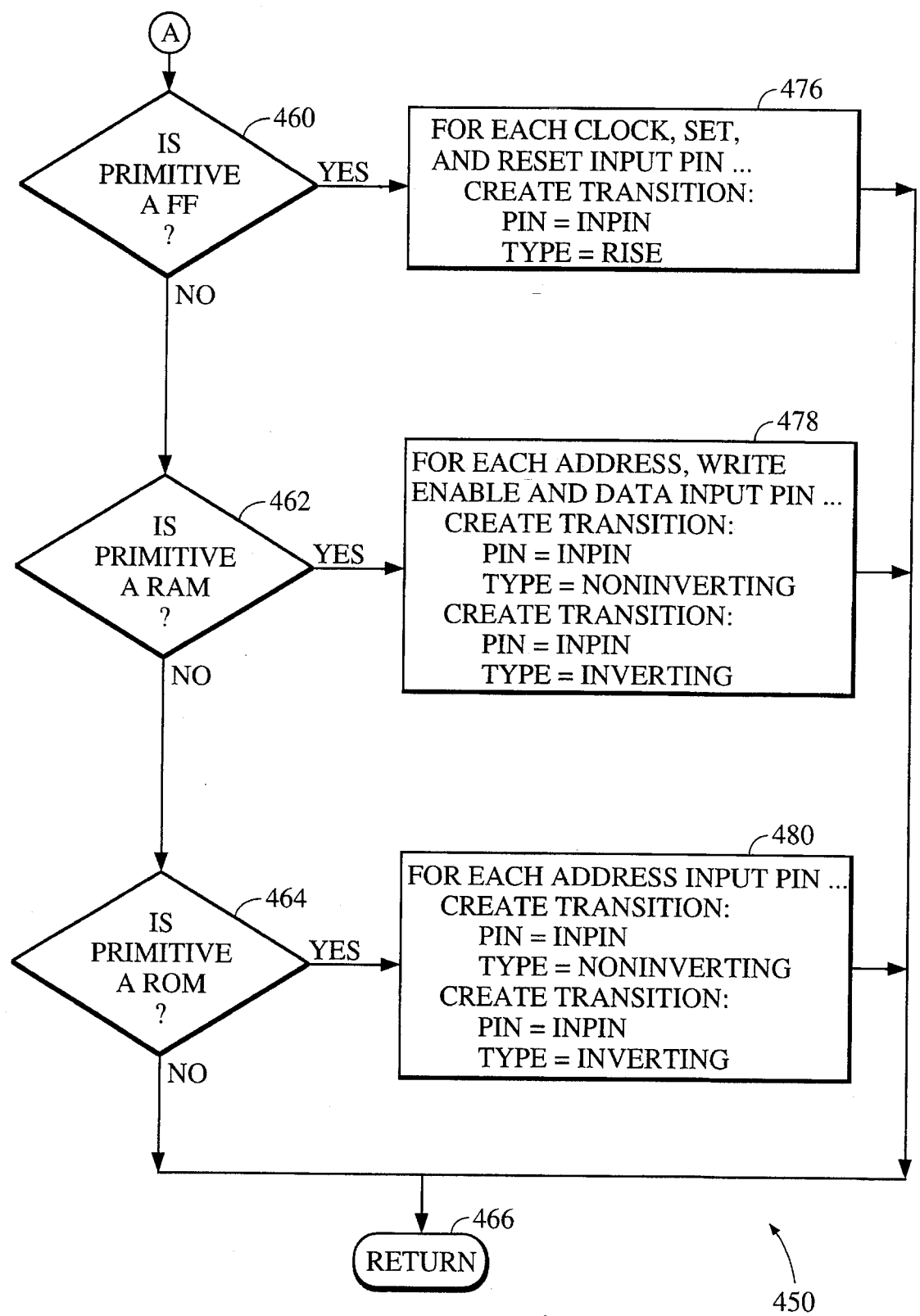

The next function called by the traverse_primitive function 300 is the get_outin_transitions function 450, shown in FIGS. 17a and 17b. This function gets all output to input transitions for the given primitive. This occurs only during the backward tracing of SETUP equations.

First, the process tests 452 to see if the primitive is an AND, OR or BUFFER gate. If not, the process tests 454 to determine if the primitive is an exclusive or (XOR) gate. Similarly, if not, the process continues to test for the following types of primitives: a tri-state buffer 456; a latch 458; a flip-flop 460; a RAM 462; and a ROM 464. If the primitive is none of these types, then the process returns 466 to the function which called this function.

However, if the primitive is one of these types, then transitions will be created in each case. If the primitive is an AND, OR or BUFFER gate, then for each input pin, a transition is created 468, setting pin equal to the input pin and the type equal to NONINVERTING. If the primitive is an exclusive or (XOR), then for each input pin, two transitions are created 470, each having pin equal to inpin and one having a NONINVERTING type and the other an INVERTING type. If the primitive is a tri-state buffer, then three transitions are created 472, one having a pin equal to inpin and type equal to NONINVERTING. The last two transitions have pin equal to enable pin and type equal to NONINVERTING in one case and INVERTING in the other. If the primitive is a latch, then for each clock, set, reset and data input pin, a pair of transitions are created 474, having pin equal to inpin and one having a NONINVERTING type and the second having an INVERTING type. If the primitive is a flip-flop, then for each clock, set, and reset input pin, a transition is created 476 having pin equal to inpin and type equal to RISE. If the primitive is a RAM, then for each address, write enable and data input pin, two transitions are created 478, each having pin equal to inpin and one having NONINVERTING type and the other having an INVERTING type. If the primitive is a ROM, then for each address input pin, two transitions are created 480, each having pin equal to inpin and one having a NONINVERTING type and the other an INVERTING type. After the transitions are created in each case, the process returns 466 to the function which called this function.

The above-described process flow may also be understood with respect to the following pseudocode representation.

```
// get all primitive transitions for output → input paths
get_outin_transitions(primitive, outpin) {
    if (primitive is AND/OR/BUF)
        for each input pin
            create transition(input, NONINVERTING)
    else if (primitive is XOR)
        for each input pin
            create transition(inpin, NONINVERTING)
            create transition(inpin, INVERTING)
    else if (primitive is TRI)
            create transition(inpin, NONINVERTING)
            create transition(enablepin, NONINVERTING)
            create transition(enablepin, INVERTING)
    else if (primitive is LATCH)
        for each clock, set, reset, and data input pin
            create transition(inpin, NONINVERTING)
            create transition(inpin, INVERTING)
    else if (primitive is FF)
        for each clock, set, and reset input pin
            create transition(inpin, RISE)
    else if (primitive is RAM)
        for each address, write enable, data input pin
            create transition(inpin, NONINVERTING)
            create transition(inpin, INVERTING)
    else if (primitive is ROM)
        for each address input pin
            create transition(inpin, NONINVERTING)
            create transition(inpin, INVERTING)
```

Traverse_outin

Figure 18:
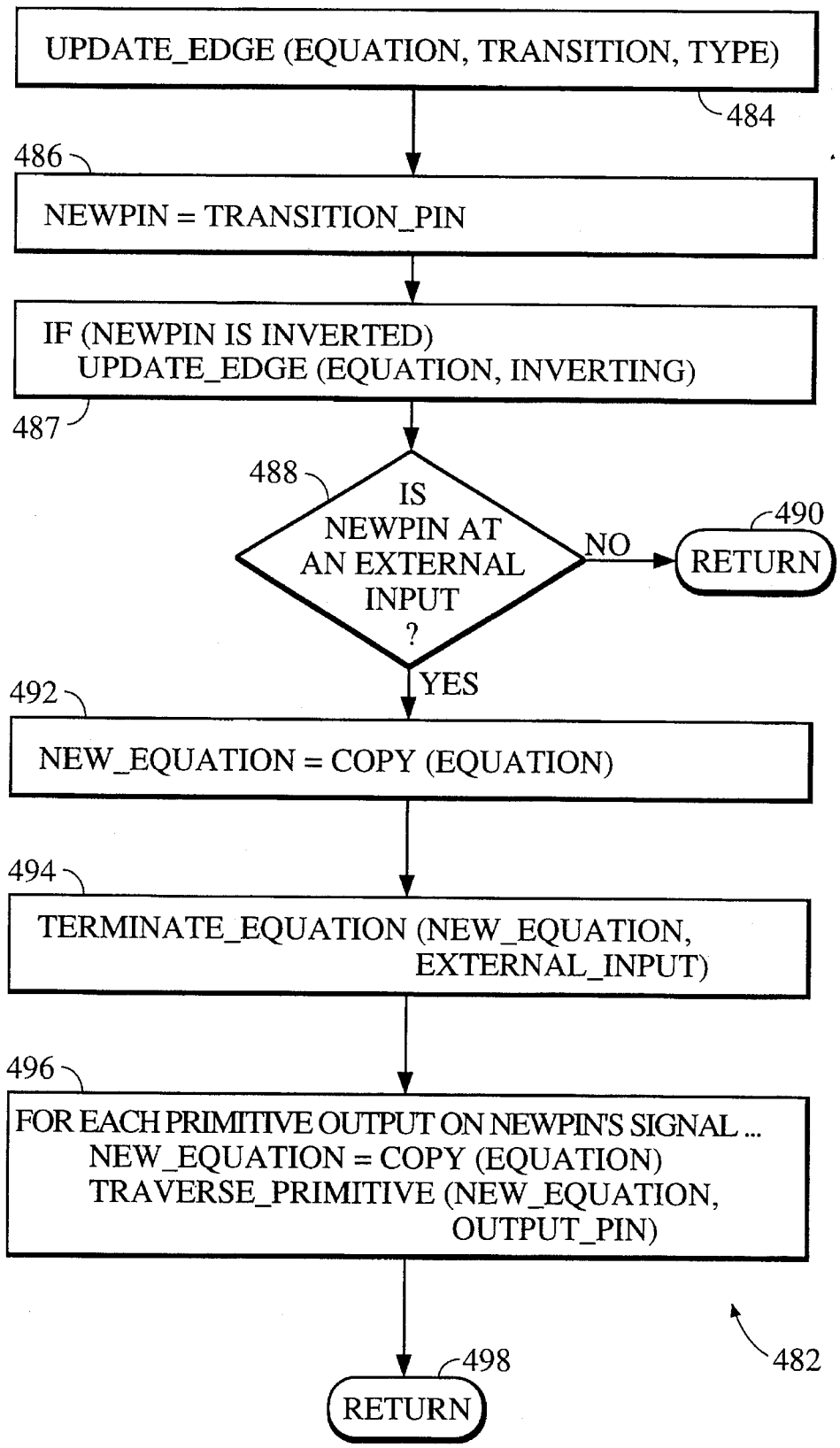
FIG. 18 is a flow diagram of a process known as traverse_outin.

The next function called by the traverse_primitive function 300 is the traverse_outin function 482 shown in FIG. 18. This function traverses a primitive from its output to all inputs and adds terms and duplicates the equation as necessary for each output to input transition.

First, the function 482 calls 484 the update_edge function described further below which updates the final edge of the equation based on the type of transition. Next, a variable, newpin is used to store 486 the value of the pin of the transition of interest. If the newpin is inverted, then the update_edge function described below is called 487. Next, a test 488 is made to determine if newpin is at an external input of the circuit. If it is not, then the traverse_outin function 482 is completed and the process returns 490 to the function which called it.

However, if the external input has been reached, then the equation is copied 492 into a variable called new_equation. Next, the terminate_equation function described further below is called 494. After this, for each primitive output which is connected to newpin, the equation is copied into the previously described variable new_equation and the traverse_primitive function is called for this new_equation 496. After this is completed, the process returns 498 to the function which called this function.

The above-described process flow may also be understood with respect to the following pseudocode representation.

```
// traverse a primitive on a given output → input
//     transition
traverse_outin(equation, transition) {
        update_edge(equation, transition.type)
        newpin = transition.pin
        if (newpin is inverted)
                update_edge(equation, INVERTING)
        if (newpin at external input)
                new_equation = copy(equation)
                terminate_equation(new_equation,
                    external_input)
        for each primitive output on newpin's signal
                new_equation = copy(equation)
                traverse_primitive(new_equation,
                    output_pin)
```

Update_edge

Figure 19:
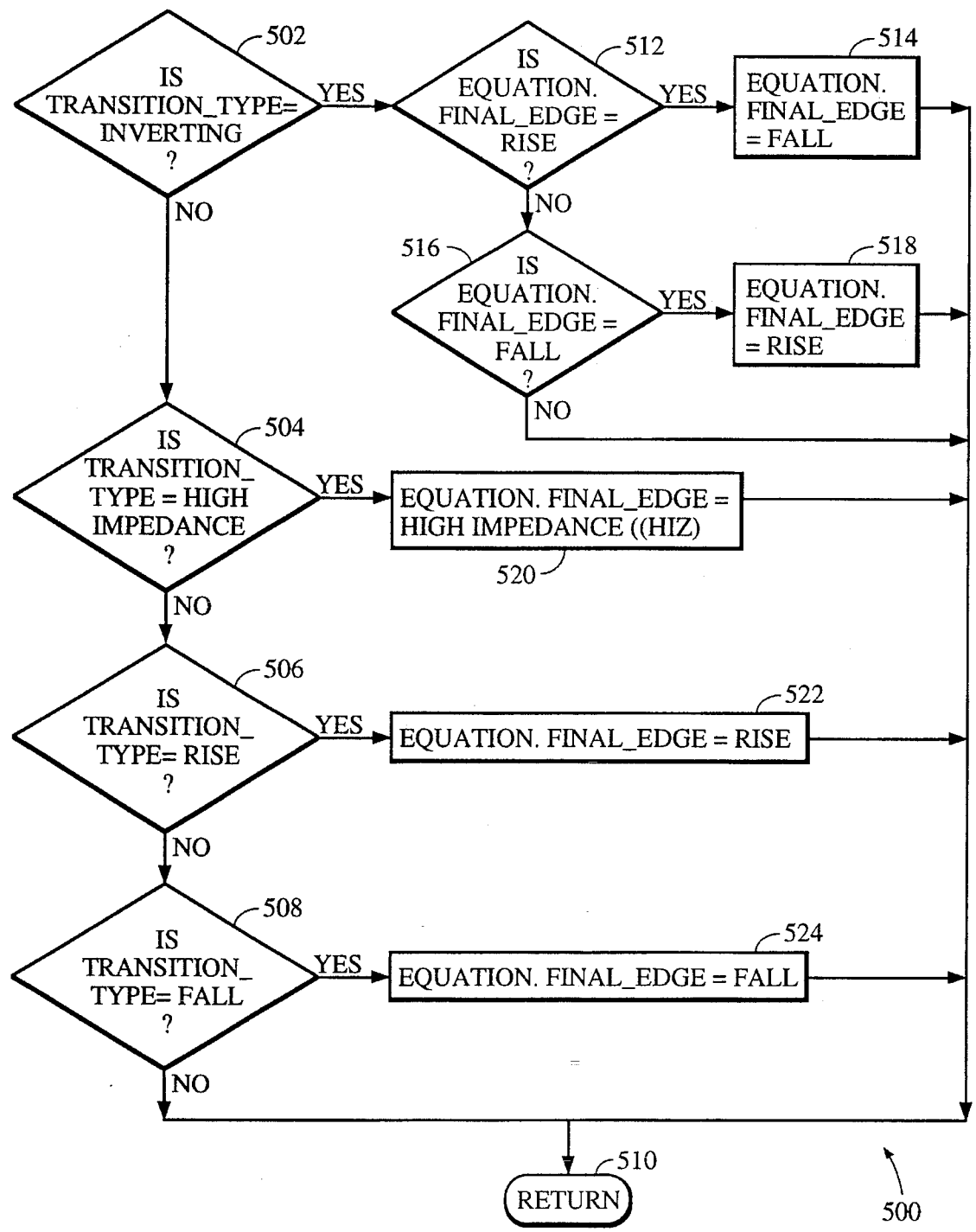
FIG. 19 is a flow diagram of a process known as update_edge.

The next function is one called by the traverse_inout 380, traverse_inclock 420 and traverse_outin 482 functions. This function, the update_edge function 500, shown in FIG. 19, updates the current final_edge of the equation based on a transition type.

First, the transition_type is tested 502 to determine if it is INVERTING. If it is not, the transition_type is tested 504 to determine if it is high impedance (HIZ). If not, the transition_type is tested 506 to see if it is RISE. If not, the transition_type is tested 508 to see if it is FALL. If not, the transition_type is a NONINVERTING type and, since the edge does not need to be updated for NONINVERTING transitions, the process returns 510 to the function which called this function.

However, if an INVERTING type transition is detected then a test is performed 512 to determine if the final_edge of the equation is RISE. If it is, then the final_edge of the equation is changed 514 to FALL. If the final_edge was not RISE then it is tested 516 to see if it is FALL. If the final_edge was FALL then it is changed 518 to RISE. If the final_edge was not RISE or FALL or in the case where it was and the final_edge was INVERTED, the process is returned 510 to the function which called this function.

If the transition_type was high impedance then the final_edge of the equation is set 520 to high impedance (HIZ). If the transition_type was RISE then the final_edge of the equation is set 522 to RISE. If the final_edge of the transition type was FALL then the final_edge of the equation is set 524 to FALL.

The above-described process flow may also be understood with respect to the following pseudocode representation.

```
// update the final_edge in an equation based on a
// primitive transition
update_edge(equation, transition_type) {
        if (transition_type == INVERTING)
                if (equation.final_edge == RISE)
                        equation.final_edge == FALL
                else (equation.final_edge == FALL)
                        equation.final_edge == RISE
        else if (transition_type == HIZ)
                equation.final_edge == HIZ
        else if (transition_type == RISE)
                equation.final_edge = RISE
        else if (transition_type == FALL)
                equation.final_edge = FALL
```

Terminate_equation

Figure 20:
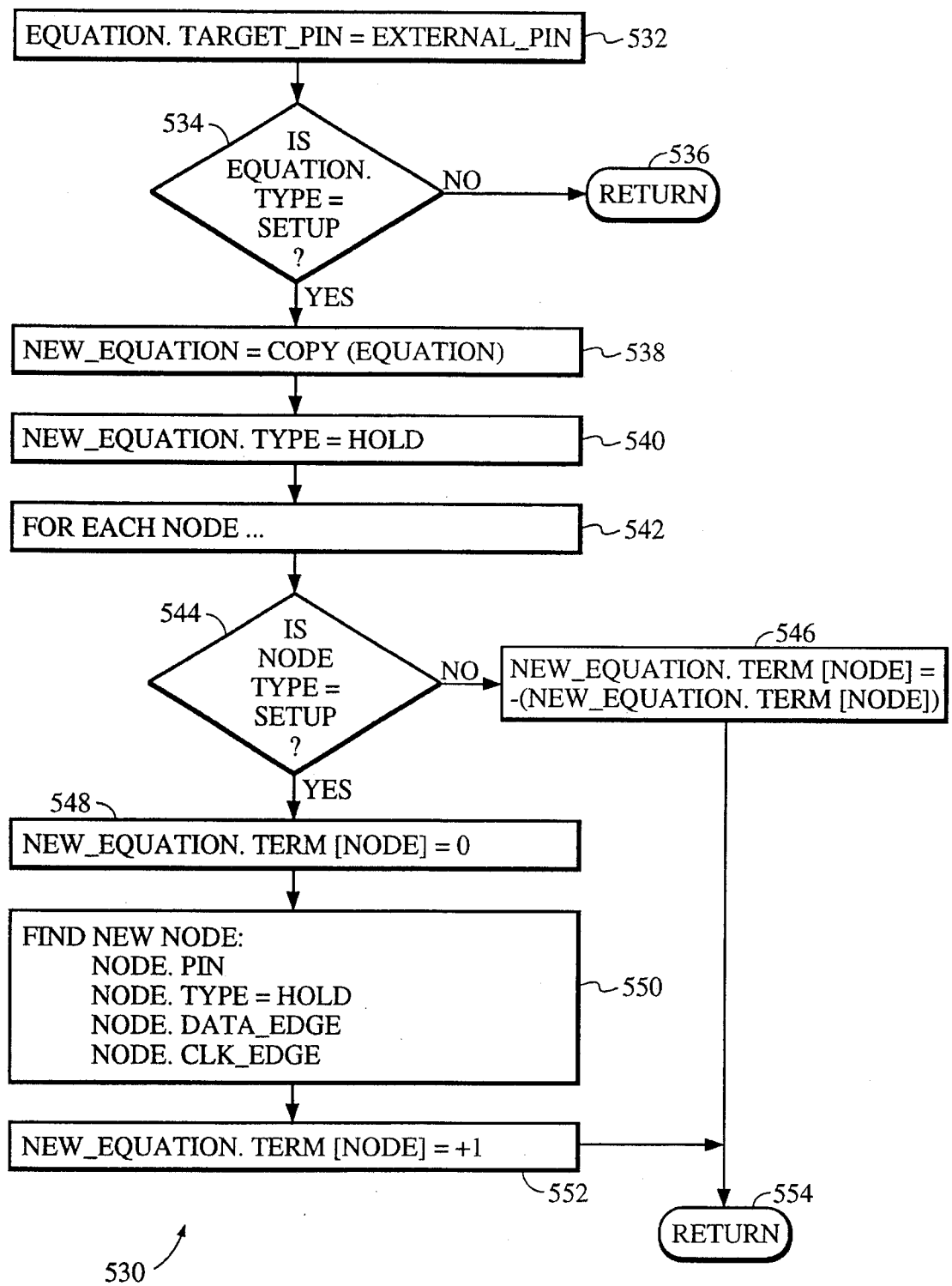
FIG. 20 is a flow diagram of a process known as terminate_equation.

The terminate_equation function 530, shown in FIG. 20, is called by several other functions. This function terminates or completes the creation of an equation making it suitable for inclusion in the linear system. In addition this function creates the HOLD equation corresponding to each SETUP equation.

First, the target_pin data field of the equation is set 532 equal to the external pin. Next, the type of equation is tested 534 to determine if it is a SETUP equation. If it is not, then the process returns 536 to the function which called this function. If it is a SETUP equation, then the equation is copied 538 into new_equation and the type for the new_equation is set 540 to HOLD. Next, for each node in the equation 542, the type of node is tested 544 to determine if it is a SETUP. If it is not, then the term of the new_equation corresponding to the node is multiplied 546 by −1 times its current value. If the node type is a SETUP, then, initially, the term of the new_equation corresponding to the node is set 548 equal to zero. Next, the new node, having the same node pin, the same data_edge and the same clk_edge but of the HOLD type, is found 550. Next, the term of the new_equation corresponding to the node is set 552 equal to +1 and the process returns to the function which called this function. In either case, after each node of the equation has been modified, the process returns 554 to the function which called it.

The above-described process flow may also be understood with respect to the following pseudocode representation.

```
// terminate an equation at an external pin
terminate_equation(equation, external_pin) {
        equation.target_pin = external_pin
        if (equation.type == SETUP)
            new_equation = copy(equation)
            new_equation.type = HOLD
            for each node
                if (node.type is SETUP)
                        new_equation.term[node] = 0
                        find newnode
                        (nod.pin, node.type =
```

```
                    HOLD, node.data_edge,
                    node.clk_edge)
            new_equation.term[newnode] = +1
        else
            new_equation.term[node] =
                -(new_equation.term[node])
```

Match_equation

Figure 21:
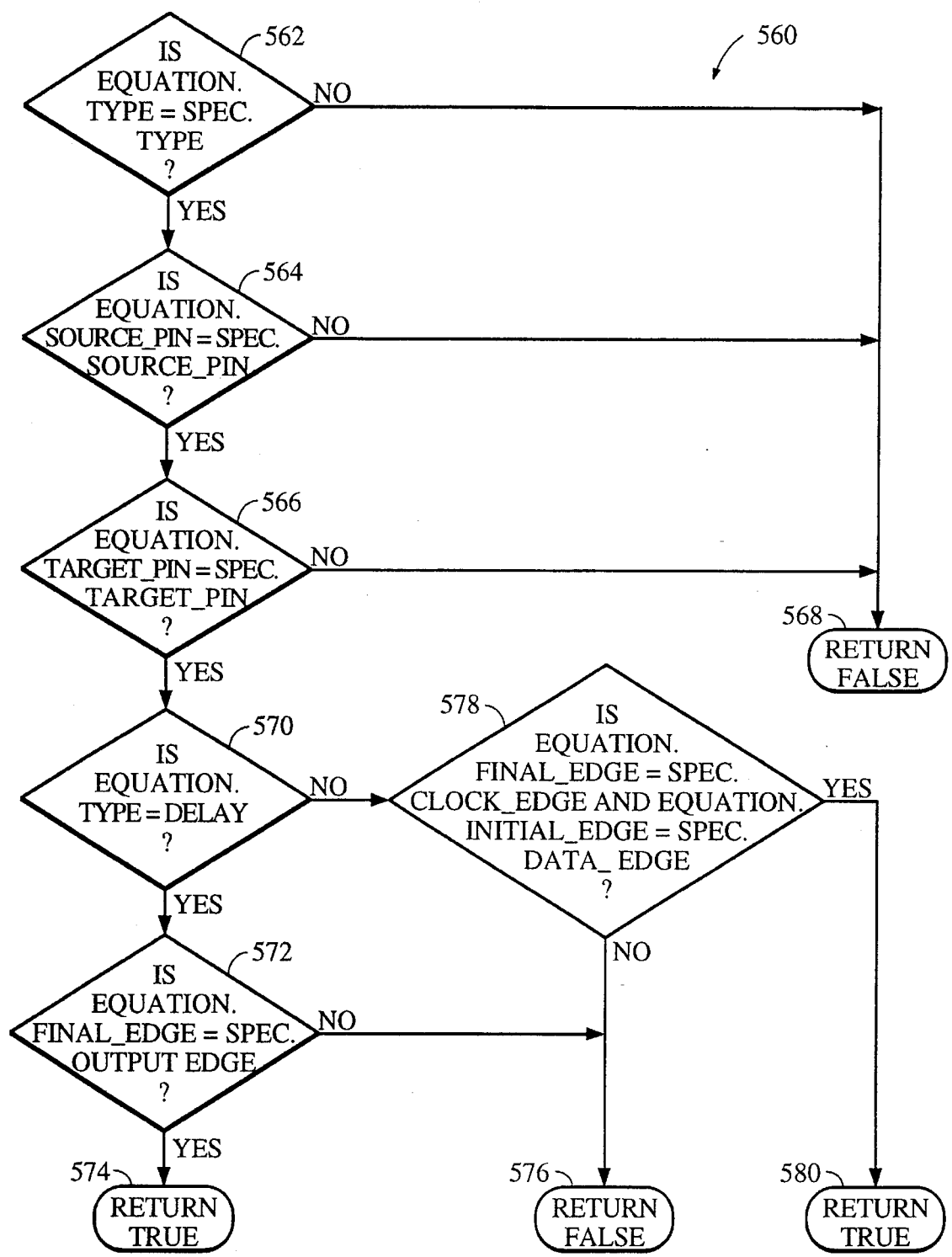
FIG. 21 is a flow diagram of a process known as match_equation.

The match_equation function 560, shown in FIG. 21, is called by the main program 218 after all the equations are created. At that point, for each external specification and for each equation, the match function is called. This function determines if a given equation and a given specification are to be matched.

First, the type of equation is tested 562 to determine if it is identical to the specification type. If yes, then the source_pin field of the equation is tested 564 to see if it is identical to the source_pin field of the specification. If yes, then the target_pin field of the equation is tested 566 to see if it is identical to the target_pin field of the specification. If the determination of any of these tests is negative, then the match is determined to be false and the process returns 568 to the function which called it.

Otherwise, the process continues by next testing 570 the type of equation to determine if it is a DELAY type. If yes, then the final_edge field of the equation is tested 572 to see if it is identical to the output_edge of the specification. If it is, then the match is determined to be true and the process returns 574 to the function which called this function. However, if the output_edge is not equal to the final_edge of the equation, then the match is determined to be false and the process returns 576 to the function which called this function.

Similarly, if the equation type is not a DELAY equation, then the final_edge of the equation is tested 578 to determine if it is identical to the clock_edge of the specification and the initial_edge of the equation is tested to determine if it is identical to the data_edge of the specification. If both of these tests are determined to be true, then the match is determined to be true and the process returns 580 to the function which called this function. Otherwise, the match is determined to be false and the process returns 576 to the function which called this function.

The above-described process flow may also be understood with respect to the following pseudocode representation.

```
// determine if an equation matches an external
// specification
Match_equation (equation, spec) {
    if (equation.type ≠ spec.type)
        return FALSE
    if (equation.source_pin ≠ spec.source_pin)
        return FALSE
    if (equation.target_pin ≠ spec.target_pin)
        return FALSE
    if (equation.type == DELAY)
        if (equation.final_edge ==
            spec.output_edge)
            return TRUE
        else
            return FALSE
    else { // setup/hold
        if ((equation.final_edge ==
            spec.clock_edge) &&
            (equation.initial_edge ==
            spec.data_edge))
            return TRUE
        else
            return FALSE
```

Advantages

As can be appreciated, the process and system of the present invention provides the capability to preserve the user's implementation in the simulation model and also to accurately perform timing analysis. Thus, the user can work with a circuit with which he or she is familiar and can more quickly understand, analyze and redesign the circuit if necessary.

In addition, the producer of this back-annotation product benefits from the fashion in which the problem of creating simulation models of circuits implemented in various FPGA vendors' architecture has been genericised. That is, separate software packages or modules are not needed to correspond with each different architecture.

Other

As FPGA architectures become more sophisticated and external specifications for cells become more complete, it is expected that it will be advantageous to expand the back-annotation process and system to include solving for minimum as well as maximum delays at each node. This will involve doubling the size and number of the linear equations. Otherwise, the process and system as described above will remain applicable to this expanded solution.

The process and system described above describes the solution to the problem at a conceptual level. The actual details of implementation may vary due to the nature of the data structures involved. For example, the data structures that describe the primitive network may be hierarchical rather than flat. In addition, incorporation of the concepts of the present invention into a larger-scale program may cause some of the implementation details to vary as well.

A presently preferred embodiment of the present invention has been described above with a degree of specificity. It should be understood, however, that this degree of specificity is directed toward the preferred embodiment. The invention itself, however, is defined by the scope of the appended claims.

The invention claimed is:

1. In a computer system comprising a processor coupled to a bus, a memory coupled to said bus and an input/output device coupled to said bus, a process for accurately distributing time delays in a simulation model of a programmable logic device containing a plurality of cells, said process comprising the computer implemented steps of:

receiving and storing in said memory timing information characteristic of said programmable logic device being programmed by mapping, placing and routing an abstract representation of a logic design including a plurality of primitives into the programmable logic device, said timing information comprising:

allowable values of timing constraints of said primitives; and pin-to-pin timing constraints associated with an individual cell of said plurality of cells;

translating said pin-to-pin timing constraints associated with an individual cell of said plurality of cells into timing constraints associated with individual primitives mapped into said individual cell, said primitives having a set of inputs and a set of outputs, wherein said translating further comprises the computer implemented steps of:

characterizing as nodes the inputs and outputs of said sets of inputs and outputs of said primitives, said nodes having predetermined characteristics;

forming one or more linear equations using said nodes and said pin-to-pin timing constraints;

grouping said one or more of said linear equations into a system of linear equations;

solving the system of linear equations to obtain the timing constraints for the individual primitives mapped into said individual cell; and storing in said memory said timing constraints obtained in said step of solving.

2. A process as defined in claim 1 wherein said step of forming equations further comprises the step of:

creating at least one equation representing a DELAY timing constraint, said DELAY timing constraint representing a delay between one of said set of inputs and one of said set of outputs of said primitives.

3. A process as defined in claim 1 wherein said set of inputs includes a clock input and said step of forming equations further comprises the step of:

creating at least one equation representing a SETUP timing constraint, said SETUP timing constraint representing a minimum allowable time between a change on one of said set of inputs and an active edge of said clock input.

4. A process as defined in claim 1 wherein said set of inputs comprises a clock input and said step of forming equations further comprises the step of:

creating at least one equation representing a HOLD timing constraint, said HOLD timing constraint representing a minimum allowable time between an active edge of said clock input and a change on one of said set of inputs.

5. A process as defined in claim 1 wherein said set of inputs are digital signals having a rising edge and a falling edge and said step of forming equations further comprises the steps of:

identifying those of said primitives which have rising active edges and those of said primitives which have falling active edges;

creating equations involving timing constraints associated with those of said primitives which have rising active edges; and creating equations involving those of said primitives which have falling active edges which are separate from, but correspond to, said equations involving timing constraints associated with those of said primitives which have rising active edges.

6. A process as defined in claim 1 wherein said system of linear equations is grouped into columns and rows where each row represents a separate equation and each column represents one of said nodes, said nodes being common to each equation, said grouping step further comprising the steps of:

prioritizing the columns based upon said predetermined characteristics of the nodes therein; and sorting the columns by priority to arrange the columns in descending order of priority.

7. A process as defined in claim 6, said solving step further comprising the steps of:

checking the timing constraints obtained against said allowable values of timing constraints to determine if any non-allowable values have been obtained; and permuting columns containing non-allowable values until said non-allowable values are eliminated.

8. In a computer system comprising a processor coupled to a bus, a memory coupled to said bus and an input/output device coupled to said bus, a process for accurately distributing time delays in a simulation model of a programmable logic device containing a plurality of cells, said process comprising the computer implemented steps of:

receiving and storing in said memory timing information characteristic of said programmable logic device being programmed by mapping, placing and routing an abstract representation of a logic design including a plurality of primitives into the programmable logic device, said timing information comprising:

allowable values of timing constraints associated said plurality of primitives; and pin-to-pin timing constraints associated with an individual cell of said plurality of cells;

translating said pin-to-pin timing constraints associated with an individual cell of said plurality of cells into timing constraints associated with individual primitives mapped into said individual cell, said primitives having a set of inputs and a set of outputs, wherein said translating further comprises the computer implemented steps of:

characterizing as nodes the inputs and outputs of said sets of inputs and outputs of said primitives, said nodes having predetermined characteristics;

forming one or more linear equations using said nodes and said pin to-pin timing constraints;

grouping said one or more of said linear equations into a system of linear equations wherein said system of linear equations is grouped into columns and rows where each row represents a separate equation and each column represents one of said nodes, said nodes being common to each equation, said grouping step further comprising:

prioritizing the columns based upon said predetermined characteristics of the nodes therein;

sorting the columns by priority to arrange the columns in descending order of priority;

solving the linear system of equations to obtain the timing constraints for the individual primitives mapped into said individual cell, said step of solving further comprising:

checking the timing constraints obtained against said allowable values of timing constraints to determine if any non-allowable values have been obtained; and permuting columns containing non-allowable values until said non-allowable values are eliminated; and storing in said memory said timing constraints obtained in said step of solving.

9. A process as defined in claim 8, said computer implemented step of forming one or more linear equations further comprising the computer implemented steps of:

creating at least one equation representing a DELAY timing constraint, said DELAY timing constraint representing the delay between one of said set of inputs and one of said set of outputs of said primitives;

creating at least one equation representing a SETUP timing constraint, said SETUP timing constraint representing a minimum allowable time between a change on one of said set of inputs and an active edge of said clock input;

creating at least one equation representing a HOLD timing constraint, said HOLD timing constraint representing a minimum allowable time between a change on one of said set of inputs and an inactive edge of said clock input;

identifying those of said primitives which have rising active edges and those of said primitives which have falling active edges;

creating equations involving timing constraints associated with those of said primitives which have rising active edges; and creating equations involving those of said primitives which have falling active edges which are separate from, but correspond to, said equations involving timing constraints associated with those of said primitives which have rising active edges.

10. In a computer system comprising a processor, a memory and an input/output device, a system for accurately distributing time delays in a simulation model of a programmable logic device containing a plurality of cells, said system comprising:

computer implemented means for receiving and storing in said memory timing information characteristic of said programmable logic device being programmed by mapping, placing and routing an abstract representation of a logic design comprising a plurality of primitives into the programmable logic device, said timing information comprising:

allowable values of timing constraints of said primitives; and pin-to-pin timing constraints associated with an individual cell of said plurality of cells;

computer implemented translating means for translating said pin-to-pin timing constraints associated with an individual cell of said plurality of cells into timing constraints associated with individual primitives mapped into said individual cell, said primitives having a set of inputs and a set of outputs, said translating means further comprising:

computer implemented means for characterizing as nodes the inputs and outputs of said sets of inputs and outputs of said primitives, said nodes having predetermined characteristics;

computer implemented means for forming one or more linear equations using said nodes and said pin-to-pin timing constraints;

computer implemented means operatively associated with said means for forming one or more linear equations for grouping the equations into a system of linear equations;

computer implemented means operatively associated with the grouping means for solving the system of linear equations to obtain the timing constraints for the individual primitives mapped into said individual cell; and computer implemented means operatively associated with said solving means for storing in said memory said timing constraints obtained in said step of solving.

11. A system as defined in claim 10 wherein said computer implemented means for forming equations further comprises:

means for creating at least one equation representing a DELAY timing constraint, said DELAY timing constraint representing the delay between one of said set of inputs and one of said set of outputs of said primitives.

12. A system as defined in claim 10 wherein said set of inputs includes a clock input and said computer implemented means for forming equations further includes:

means for creating at least one equation representing a SETUP timing constraint, said SETUP timing constraint representing a minimum allowable time between a change on one of said set of inputs and an active edge of said clock input.

13. A system as defined in claim 10 wherein said set of inputs comprises a clock input and said computer implemented means for forming equations further comprises:

means for creating at least one equation representing a HOLD timing constraint, said HOLD timing constraint representing a minimum allowable time between an active edge of said clock input and a change on one of sold set of inputs.

14. A system as defined in claim 10 wherein said set of inputs are digital signals having a rising edge and a falling edge and said computer implemented means for forming equations further comprises:

means for identifying those of said primitives which have rising active edges and those of said primitives which have falling active edges;

means for creating equations involving those of said primitives which have falling active edges which are separate from, but correspond to, said equations involving timing constraints associated with those of said primitives which have rising active edges.

15. A system as defined in claim 10 wherein said system of linear equations is grouped into columns and rows where each row represents a separate equation and each column represents one of said nodes, common to each equation, said computer implemented grouping means further comprising:

means for prioritizing the columns based upon said predetermined characteristics of the nodes therein; and means operatively associated with said prioritizing means for sorting the columns by priority to arrange the columns in descending order of priority.

16. A system as defined in claim 15, said computer implemented solving means further comprising:

means for checking the timing constraints obtained against said allowable values of timing constraints to determine if any non-allowable values have been obtained; and means operatively associated with said checking means for permuting columns containing non-allowable values until said non-allowable values are eliminated.

17. A computer system for accurately distributing timing delays in a simulation model of a programmable logic device containing a plurality of cells, said computer system comprising:

a processor coupled to a bus, a memory coupled to said bus and an input/output device coupled to said bus, wherein said processor is programmed to implement:

logic receiving and storing in said memory timing information characteristic of said programmable logic device being programmed by mapping, placing and routing an abstract representation of a logic design comprising a plurality of primitives into the programmable logic device, said timing information comprising:

allowable values of timing constraints of said primitives; and pin-to-pin timing constraints associated with an individual cell of said plurality of cells;

logic translating said pin-to-pin timing constraints associated with an individual cell of said plurality of cells into timing constraints associated with individual primitives mapped into said individual cell, said primitives having a set of inputs and a set of outputs, said logic translating said pin-to-pin timing constraints also comprising:

logic characterizing as nodes the inputs and outputs of said sets of inputs and outputs of said primitives, said nodes having predetermined characteristics;

logic forming one or more linear equations using said nodes and said pin-to-pin timing constraints;

logic grouping the equations into a system of linear equations, said grouping logic operatively associated with said logic forming one or more linear equations;

logic solving the system of linear equations to obtain the timing constraints for the individual primitives mapped into said individual cell, said solving logic operatively associated with said grouping logic; and logic storing in said memory said timing constraints obtained in said step of solving, said storing logic operatively associated with said solving logic.

18. A system as defined in claim 17 wherein said logic forming one or more linear equations further comprises:

logic creating at least one equation representing a DELAY timing constraint, said DELAY timing constraint representing the delay between one of said set of inputs and one of said set of outputs of said primitives.

19. A system as defined in claim 17 wherein said set of inputs includes a clock input and said logic forming one or more linear equations further includes:

logic creating at least one equation representing a SETUP timing constraint, said SETUP timing constraint representing a minimum allowable time between a change on one of said set of inputs and an active edge of said clock input.

20. A system as defined in claim 17 wherein said set of inputs comprises a clock input and said logic forming one or more linear equations further comprises:

logic creating at least one equation representing a HOLD timing constraint, said HOLD timing constraint representing a minimum allowable time between a change on one of said set of inputs and an inactive edge of said clock input.

21. A system as defined in claim 17 wherein said set of inputs are digital signals having a rising edge and a falling edge and said logic forming one or more linear equations further comprises:

logic identifying those of said primitives which have rising active edges and those of said primitives which have falling active edges;

logic creating equations involving those of said primitives which have falling active edges which are separate from, but correspond to, said equations involving timing constraints associated with those of said primitives which have rising active edges.

22. A system as defined in claim 17 wherein said system of linear equations is grouped into columns and rows where each row represents a separate equation and each column represents one of said nodes, common to each equation, said grouping logic further comprising:

logic prioritizing the columns based upon said predetermined characteristics of the nodes therein; and logic sorting the columns by priority to arrange the columns in descending order of priority, said sorting logic operatively associated with said prioritizing logic.

23. A system as defined in claim 22, said solving logic further comprising:

logic checking the timing constraints obtained against said allowable values of timing constraints to determine if any non-allowable values have been obtained; and logic permuting columns containing non-allowable values until said non-allowable values are eliminated, said permuting logic operatively associated with said checking logic.

* * * * *

UNITED STATES PATENT AND TRADEMARK OFFICE
CERTIFICATE OF CORRECTION

PATENT NO. : 5,581,738
DATED : December 3, 1996
INVENTOR(S) : Peter F. Dombrowski It is certified that error appears in the above-identified patent and that said Letters Patent is hereby corrected as shown below:

Col. 13, line 37, "(equation, input_in)" should read --(equation, input_pin)--.

Signed and Sealed this

Seventeenth Day of February, 1998

*Attest:*

BRUCE LEHMAN

*Attesting Officer*   *Commissioner of Patents and Trademarks*